United States Patent
Ladizinsky et al.

(10) Patent No.: US 9,634,224 B2
(45) Date of Patent: Apr. 25, 2017

(54) SYSTEMS AND METHODS FOR FABRICATION OF SUPERCONDUCTING CIRCUITS

(71) Applicant: D-Wave Systems Inc., Burnaby (CA)

(72) Inventors: Eric Ladizinsky, Manhattan Beach, CA (US); Nicolas Ladizinsky, Burnaby (CA); Jason Yao, San Ramon, CA (US); Byong Hyop Oh, San Jose, CA (US); Richard David Neufeld, Burnaby (CA)

(73) Assignee: D-Wave Systems Inc., Burnaby (CA)

( * ) Notice: Subject to any disclaimer, the term of this patent is extended or adjusted under 35 U.S.C. 154(b) by 0 days.

(21) Appl. No.: 14/600,962

(22) Filed: Jan. 20, 2015

(65) Prior Publication Data

US 2015/0236235 A1    Aug. 20, 2015

Related U.S. Application Data

(60) Provisional application No. 61/940,278, filed on Feb. 14, 2014, provisional application No. 61/979,406, (Continued)

(51) Int. Cl.
*H01L 39/24* (2006.01)
*H01L 27/18* (2006.01)
*H01L 39/22* (2006.01)

(52) U.S. Cl.
CPC .......... *H01L 39/2493* (2013.01); *H01L 27/18* (2013.01); *H01L 39/223* (2013.01)

(58) Field of Classification Search
CPC .......................... H01L 27/18; H01L 39/2493
See application file for complete search history.

(56) References Cited

U.S. PATENT DOCUMENTS 6,541,789 B1 * 4/2003 Sato .................... H01L 39/2496
                                                            257/31
7,533,068 B2    5/2009 Maassen van den Brink et al.
(Continued)

OTHER PUBLICATIONS

Ladizinsky et al., "Method of Forming Low-Spread Josephson Junction," U.S. Appl. No. 61/979,406, filed Apr. 14, 2014, 41 pages.
(Continued)

*Primary Examiner* — Lex Malsawma
*Assistant Examiner* — Xia Cross
(74) *Attorney, Agent, or Firm* — Seed IP Law Group LLP

(57) ABSTRACT

In one aspect, fabricating a superconductive integrated circuit with a Josephson junction includes applying oxygen or nitrogen to at least part of a structure formed from an outer superconductive layer to passivate an artifact, if any, left from removing the portion of the outer superconductive layer. In another aspect, a first superconductive layer is deposited, a second superconductive layer is deposited on the first superconductive layer, an oxide layer is formed on the first superconductive layer, a dielectric layer is deposited on the oxide layer, a portion of the dielectric layer is removed, a first portion of the oxide layer is removed, a second oxide portion is formed in place of the first portion of the oxide layer, and a third superconductive layer is deposited on the dielectric layer and the second oxide portion.

10 Claims, 19 Drawing Sheets

Related U.S. Application Data filed on Apr. 14, 2014, provisional application No. 61/987,782, filed on May 2, 2014.

(56) References Cited

U.S. PATENT DOCUMENTS

| | | |
|---|---|---|
| 7,876,248 B2 | 1/2011 | Berkley et al. |
| 8,008,942 B2 | 8/2011 | van den Brink et al. |
| 8,035,540 B2 | 10/2011 | Berkley et al. |
| 8,190,548 B2 | 5/2012 | Choi |
| 8,195,596 B2 | 6/2012 | Rose et al. |
| 8,301,214 B1 * | 10/2012 | Tolpygo .................. H01L 27/18 505/190 |
| 8,421,053 B2 | 4/2013 | Bunyk et al. |
| 8,951,808 B2 | 2/2015 | Ladizinsky et al. |
| 2012/0319211 A1 * | 12/2012 | van Dal ............ H01L 29/66795 257/401 |

OTHER PUBLICATIONS

Ladizinsky et al., "Method of Forming Low-Spread Josephson Junction," U.S. Appl. No. 61/987,782, filed May 2, 2014, 43 pages.

Ladizinsky et al., "Systems and Methods for Fabrication of Superconducting Integrated Circuits," U.S. Appl. No. 61/156,377, filed Feb. 27, 2009, 89 pages.

Ladizinsky et al., "Systems and Methods for Fabrication of Superconducting Integrated Circuits," U.S. Appl. No. 61/608,379, filed Mar. 8, 2012, 101 pages.

Ladizinsky et al., "Systems and Methods for Fabrication of Superconducting Integrated Circuits," U.S. Appl. No. 61/714,642, filed Oct. 16, 2012, 104 pages.

Yao, "Method of Forming Ultra-Small Josephson Junctions," U.S. Appl. No. 61/940,278, filed Feb. 14, 2014, 54 pages.

* cited by examiner

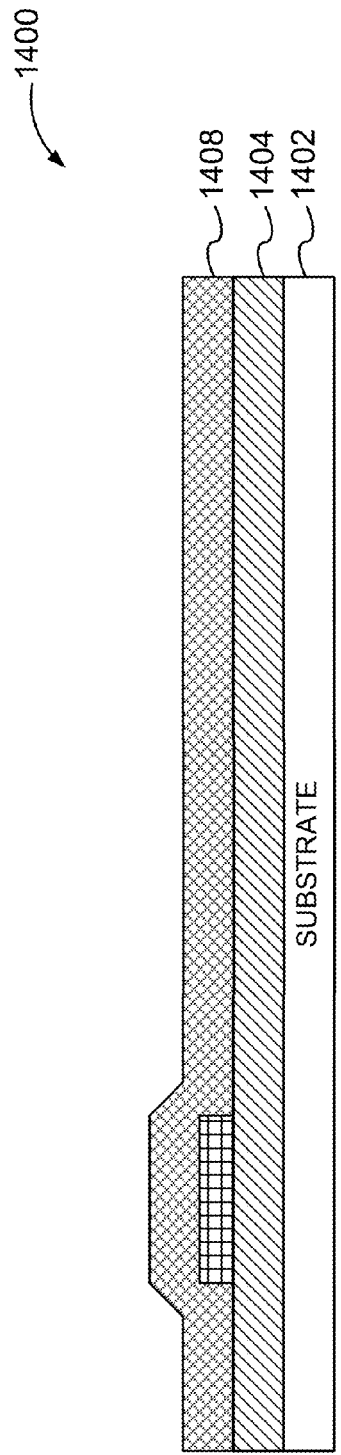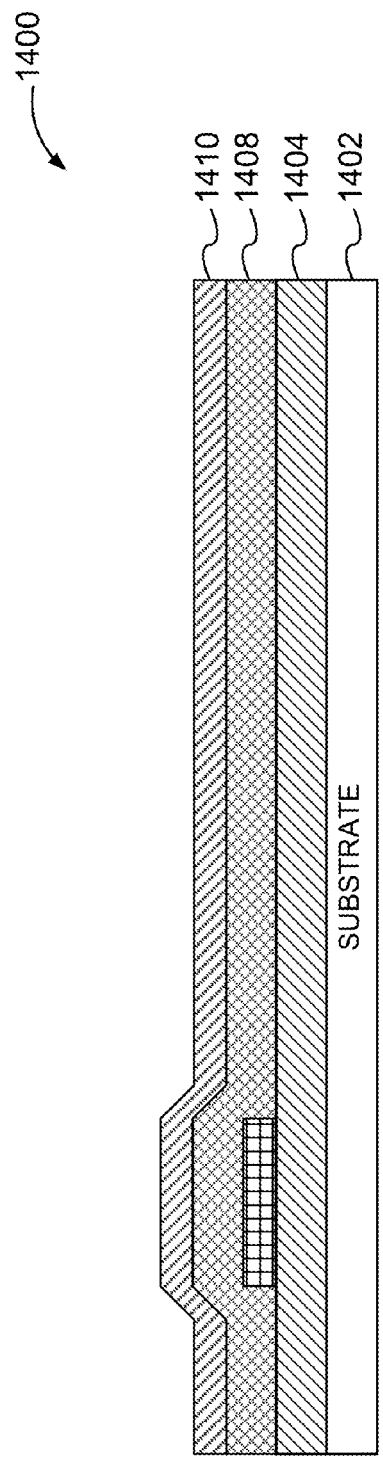
FIG. 14C
FIG. 14D

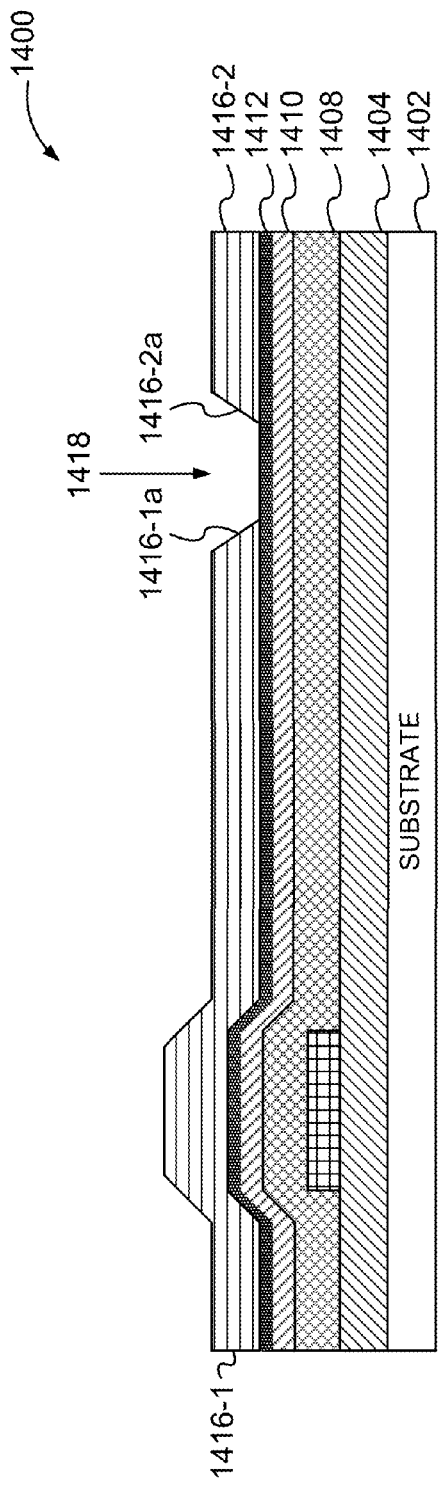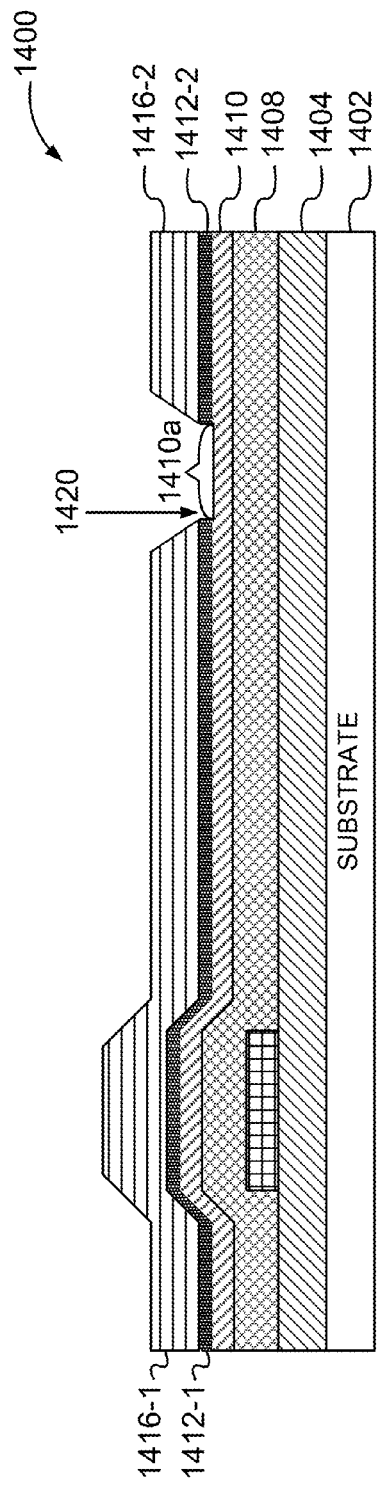

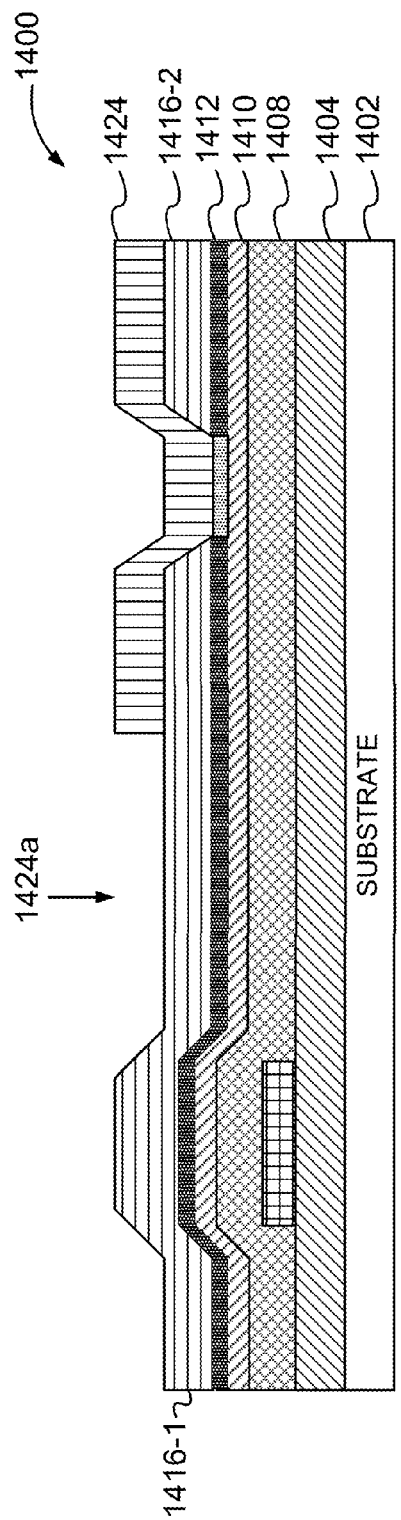
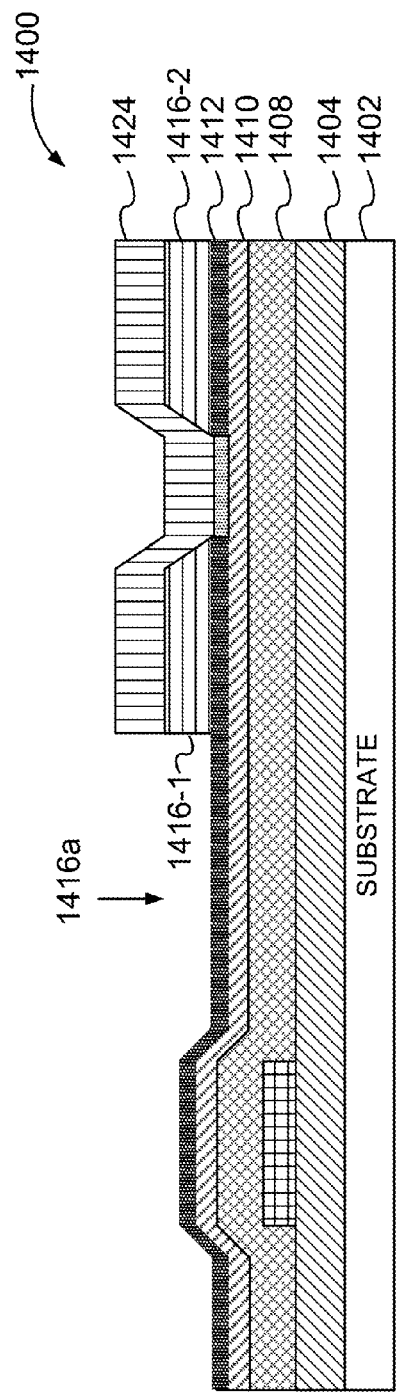
FIG. 14K
FIG. 14L

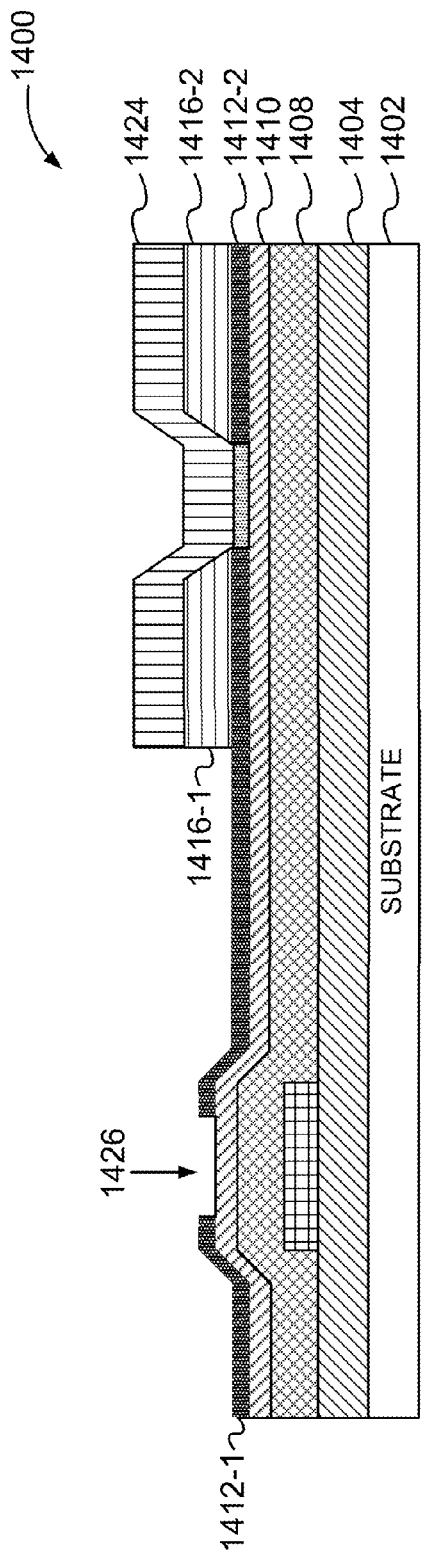
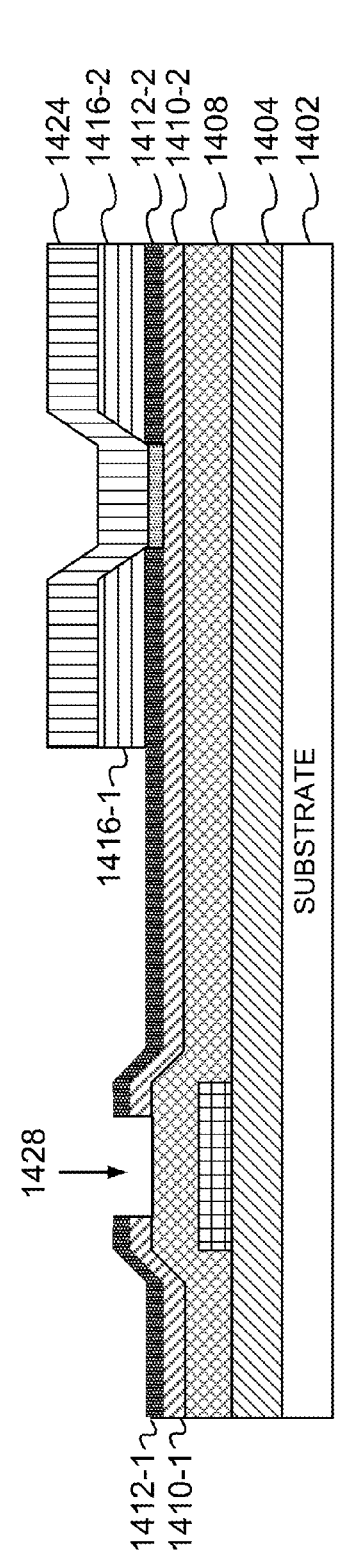
FIG. 14M
FIG. 14N

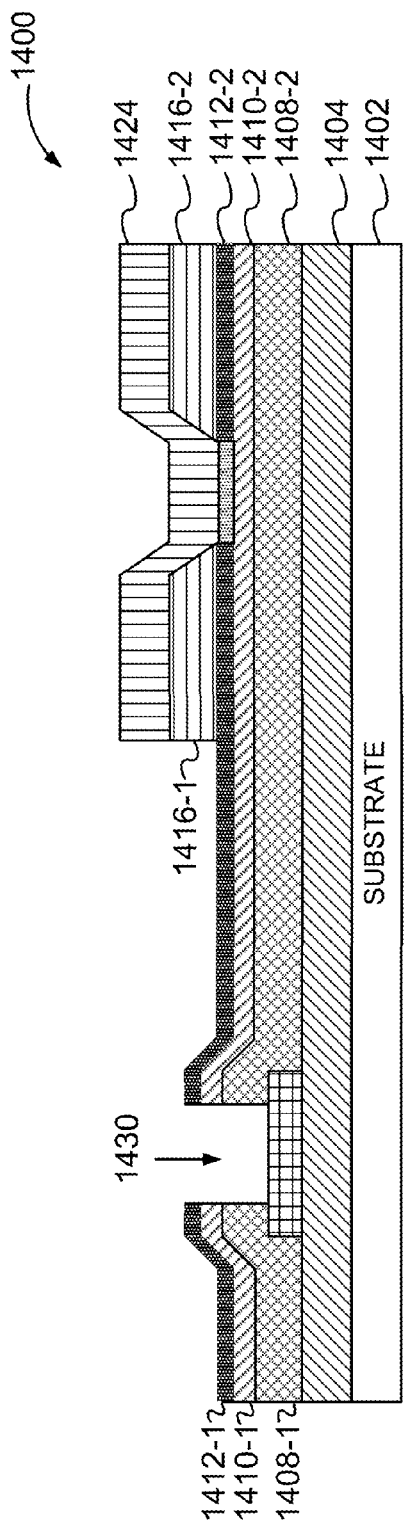
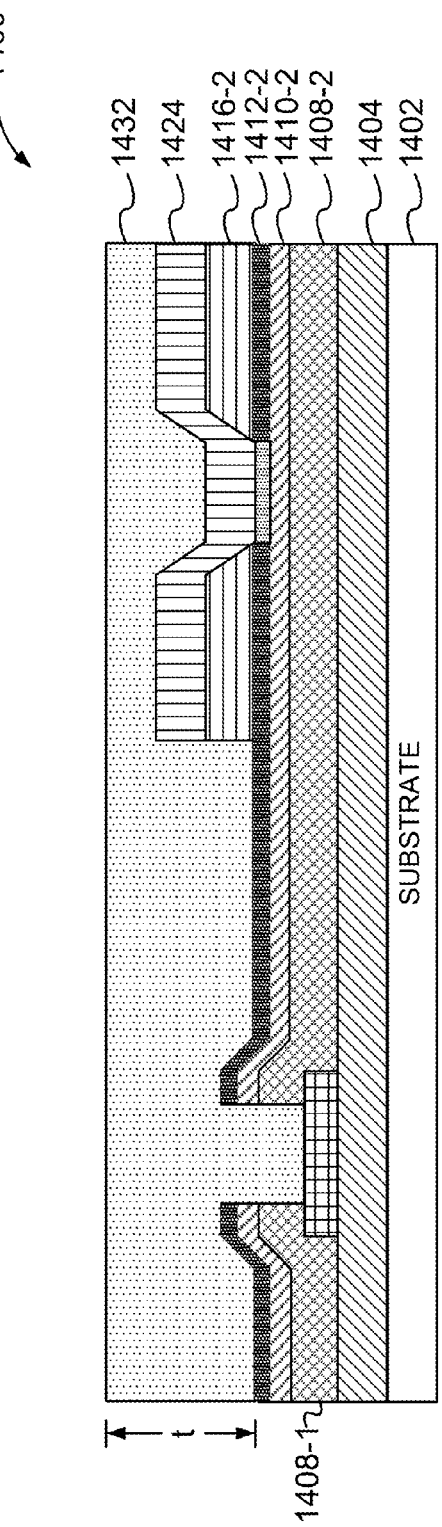
FIG. 14O
FIG. 14P

SYSTEMS AND METHODS FOR FABRICATION OF SUPERCONDUCTING CIRCUITS

BACKGROUND

Technical Field

The present systems and methods relate to the fabrication of superconducting integrated circuits that include Josephson junctions.

Josephson Junctions

A Josephson junction is a common element in superconducting integrated circuits. Physically, a Josephson junction is a small interruption in an otherwise continuous superconducting current path, typically realized by a thin insulating barrier sandwiched in between two superconducting electrodes. In superconducting integrated circuits, Josephson junctions are typically fabricated as a stack comprising a superconducting base electrode overlaid with a thin insulating layer, which is then overlaid with a superconducting counter electrode. Thus, a Josephson junction is usually formed as a three-layer, or "trilayer," structure. A trilayer may be deposited completely over an entire wafer (i.e., in the same way that metal wiring and dielectric layers are deposited) and then patterned to define individual Josephson junctions.

Integrated Circuit Fabrication

Traditionally, the fabrication of superconducting integrated circuits has not been performed at state-of-the-art semiconductor fabrication facilities. This may be due to the fact that some of the materials used in superconducting integrated circuits can contaminate the semiconductor facilities. For instance, gold may be used as a resistor in superconducting circuits, but gold can contaminate a fabrication tool used to produce complementary metal-oxide-semiconductor (CMOS) wafers in a semiconductor facility. Consequently, superconducting integrated circuits containing gold are typically not processed by tools which also process CMOS wafers.

Superconductor fabrication has typically been performed in research environments where standard industry practices could be optimized for superconducting circuit production. Superconducting integrated circuits are often fabricated with tools that are traditionally used to fabricate semiconductor chips or integrated circuits. Due to issues unique to superconducting circuits, not all semiconductor processes and techniques are necessarily transferrable to superconductor chip manufacture. Transforming semiconductor processes and techniques for use in superconductor chip and circuit fabrication often requires changes and fine adjustments. Such changes and adjustments typically are not obvious and may require a great deal of experimentation. The semiconductor industry faces problems and issues not necessarily related to the superconducting industry. Likewise, problems and issues that concern the superconducting industry are often of little or no concern in standard semiconductor fabrication.

Any impurities within superconducting chips may result in noise which can compromise or degrade the functionality of the individual devices, such as superconducting qubits, and of the superconducting chip as a whole. Since noise is a serious concern to the operation of quantum computers, measures should be taken to reduce dielectric noise wherever possible.

Etching

Etching removes layers of, for example, substrates, dielectric layers, oxide layers, electrically insulating layers and/or metal layers according to desired patterns delineated by photoresists or other masking techniques. Two exemplary etching techniques are wet chemical etching and dry chemical etching.

Wet chemical etching or "wet etching" is typically accomplished by submerging a wafer in a corrosive bath such as an acid bath. In general, etching solutions are housed in polypropylene, temperature-controlled baths. The baths are usually equipped with either a ring-type plenum exhaust ventilation or a slotted exhaust at the rear of the etch station. Vertical laminar-flow hoods are typically used to supply uniformly-filtered, particulate-free air to the top surface of the etch baths.

Dry chemical etching or "dry etching" is commonly employed due to its ability to better control the etching process and reduce contamination levels. Dry etching effectively etches desired layers through the use of gases, either by chemical reaction such as using a chemically reactive gas or through physical bombardment, such as plasma etching, using, for example, argon atoms.

Plasma etching systems have been developed that can effectively etch, for example, silicon, silicon dioxide, silicon nitride, aluminum, tantalum, tantalum compounds, chromium, tungsten, gold, and many other materials. Two types of plasma etching reactor systems are in common use—the barrel reactor system and the parallel plate reactor system. Both reactor types operate on the same principles and vary primarily in configuration. The typical reactor consists of a vacuum reactor chamber made usually of aluminum, glass, or quartz. A radiofrequency or microwave energy source (referred to collectively as RF energy source) is used to activate etchants, for example, fluorine-based or chlorine-based gases. Wafers are loaded into the chamber, a pump evacuates the chamber, and the reagent gas is introduced. The RF energy ionizes the gas and forms the etching plasma, which reacts with the wafers to form volatile products which are pumped away.

Physical etching processes employ physical bombardment. For instance, argon gas atoms may be used to physically bombard a layer to be etched, and a vacuum pump system removes dislocated material. Sputter etching is one physical technique involving ion impact and energy transfer. The wafer to be etched is attached to a negative electrode, or "target," in a glow-discharge circuit. Positive argon ions bombard the wafer surface, resulting in the dislocation of the surface atoms. Power is provided by an RF energy source. Ion beam etching and milling are physical etching processes which use a beam of low-energy ions to dislodge material. The ion beam is extracted from an ionized gas (e.g., argon or argon/oxygen) or plasma, created by an electrical discharge. Reactive-ion etching (RIE) is a combination of chemical and physical etching. During RIE, a wafer is placed in a chamber with an atmosphere of chemically reactive gas (e.g., $CF_4$, $CCl_4$ and many other gases) at a low pressure. An electrical discharge creates an ion plasma with an energy of a few hundred electron volts. The ions strike the wafer surface vertically, where they react to form volatile species that are removed by the low pressure in-line vacuum system.

Planarization

The use of chemical-mechanical planarization (CMP) allows for a near flat surface to be produced. CMP is a standard process in the semiconductor industry. The CMP process uses an abrasive and corrosive chemical slurry in conjunction with a polishing pad and retaining ring, typically of a greater width than the wafer. The pad and wafer are pressed together by a dynamic polishing head and held in place by a plastic retaining ring. The dynamic polishing head is rotated with different axes of rotation (i.e., not concentric). This removes material and tends to even out any irregular topography, making the wafer more flat or planar. The process of material removal is not simply that of abrasive scraping, like sandpaper on wood. The chemicals in the slurry also react with and/or weaken the material to be removed such that certain materials can be preferentially removed while leaving others relatively intact. The abrasive accelerates this weakening process and the polishing pad helps to wipe the reacted materials from the surface. Advanced slurries can be used to preferentially remove areas of the wafer which are relatively high or protrude in relation to areas of the wafer which are relatively low in order to planarize the topography of the wafer.

Plasma Oxidation

Plasma oxidation is an electrochemical surface treatment process for generating oxide coatings on metals. An electromagnetic source can be used to transform oxygen gas into oxygen plasma that is directed toward a metallic object. When the resulting oxygen plasma is applied to a surface of a metal, an oxide coating grows on the surface of the metal. The coating is a chemical conversion of the metal into its oxide, which grows both inwardly and outwardly from the surface of the metal. Because the oxide coating is nonconductive, plasma oxidation can be employed to passivate the surface of the metal.

Nitridization

Nitriding processes may be employed to diffuse nitrogen into the surface of a metal. Examples of nitriding processes include gas nitriding, salt bath nitriding, and plasma nitriding. A nitrogen-rich gas, such as ammonia ($NH_3$) gas, may be used in a gas nitriding process. For example, when ammonia gas comes into contact with a heated metal, it disassociates into hydrogen and nitrogen, which diffuses onto the surface of the metal forming a nitride layer. A nitrogen-containing salt (e.g., cyanide salt) may be used in a salt bath nitriding process that causes the salt to donate nitrogen and carbon to the surface of the metal. Salt bath nitriding processes are typically performed in a temperature range of approximately 550-590° C. Plasma nitriding processes generate intense electric fields to ionize molecules of a gas that includes nitrogen (e.g., pure nitrogen gas) around the surface of a metal to form a nitride layer on the surface of the metal. Plasma nitriding processes may be performed inside vacuum chambers at low-pressures.

Anodization

Anodizing processes are electrolytic passivation processes that may be employed to increase the thickness of an oxide layer on the surface of a metal. Such processes are called anodizing processes because the metal to be treated forms the anode electrode (i.e., positive electrode) of an electrical circuit that includes an electrolytic solution. An electric power source passes a current (e.g., direct current) through the electrical circuit that includes an electrolytic solution and the metal serving as the anode of the electrical circuit. The current releases hydrogen at the cathode (i.e., negative electrode) and oxygen at the surface of the metal (i.e., anode electrode), which forms a layer of a metallic oxide on the metal. The thickness of the oxide layer depends on the magnitude of the voltage and the amount of time the voltage is applied to the electrical circuit.

BRIEF SUMMARY

A method of fabricating a Josephson junction may be summarized as including: depositing an inner superconductive layer, the inner superconductive layer comprising a material that is superconductive in a range of critical temperatures; forming an oxide layer that overlies at least part of the inner superconductive layer; depositing an outer superconductive layer to overlie at least part of the oxide layer, the outer superconductive layer comprising a material that is superconductive in a range of critical temperatures; removing a portion of the outer superconductive layer to form at least one structure from the outer superconductive layer; and disposing a second oxide layer or a nitride layer on a second portion of the outer superconductive layer to passivate an artifact, if any, on the second portion of the outer superconductive layer.

A method of fabricating a Josephson junction may be summarized as including: depositing an inner superconductive layer, the inner superconductive layer comprising a material that is superconductive in a range of critical temperatures; forming an oxide layer that overlies at least part of the inner superconductive layer; depositing an outer superconductive layer to overlie at least part of the oxide layer, the outer superconductive layer comprising a material that is superconductive in a range of critical temperatures; removing a portion of the outer superconductive layer to form at least one structure from the outer superconductive layer; and applying plasma to at least part of the at least one structure formed from the outer superconductive layer to passivate an artifact, if any, left from removing the portion of the outer superconductive layer.

Removing the portion of the outer superconductive layer may leave at least one artifact, and applying plasma to at least part of the at least one structure formed from the outer superconductive layer may include applying plasma to the at least one artifact. Removing the portion of the outer superconductive layer may leave at least one artifact at the base of the at least one structure, and applying plasma to at least part of the at least one structure formed from the outer superconductive layer may include applying plasma to the at least one artifact at the base of the at least one structure. Removing the portion of the outer superconductive layer may include reactive-ion etching the portion of the outer superconductive layer to form a junction that extends from the oxide layer and which has at least one exposed peripheral surface. Applying plasma to at least part of the at least one structure formed from the outer superconductive layer may be performed after reactive-ion etching the portion of the outer superconductive layer. Applying plasma to at least part of the at least one structure formed from the outer superconductive layer may include applying plasma to one or more lateral surfaces of the outer superconductive layer. The method may further include: forming a mask layer on an exposed surface of the outer superconductive layer before removing the portion of the outer superconductive layer, wherein applying oxygen plasma to at least part of the at least one structure formed from the outer superconductive layer includes applying plasma to at least part of the outer superconductive layer on which the mask layer is not formed. Applying plasma to at least part of the outer superconductive layer on which the mask layer is not formed may include applying plasma to one or more portions of the outer superconductive layer disposed between the mask layer and the oxide layer. Forming a mask layer on an exposed surface of the outer superconductive layer may include forming a mask layer on an upper surface of the outer superconductive layer. The method may further include: removing at least part of the mask layer. Depositing the inner superconductive layer may include depositing a layer of niobium or aluminum; depositing the outer superconductive layer may include depositing a layer of niobium; and forming the oxide layer may include forming a layer of niobium oxide or aluminum oxide. The method may further include: depositing a dielectric layer to overlie at least part of a substrate, wherein depositing the inner superconductive layer includes depositing the inner superconductive layer to overlie at least part of the dielectric layer. The method may further include: depositing an intermediate superconductive layer to overlie at least part of the inner superconductive layer, the intermediate superconductive layer comprising a material that is superconductive in a range of critical temperatures. Depositing the inner superconductive layer may include depositing a layer of niobium; depositing the intermediate superconductive layer may include depositing a layer of aluminum; depositing the outer superconductive layer may include depositing a layer of niobium; and forming the oxide layer may include forming a layer of aluminum oxide. Applying plasma to at least part of the at least one structure formed from the outer superconductive layer may include applying oxygen plasma to at least part of the at least one structure formed from the outer superconductive layer. Applying plasma to at least part of the at least one structure formed from the outer superconductive layer may include applying nitrogen plasma to at least part of the at least one structure formed from the outer superconductive layer.

A method of fabricating a Josephson junction may be summarized as including: depositing an inner superconductive layer on at least part of the dielectric layer, the inner superconductive layer comprising a material that is superconductive in a range of critical temperatures; forming an oxide layer on at least part of the inner superconductive layer; depositing an outer superconductive layer on at least part of the oxide layer, the second superconductive layer comprising a material that is superconductive in a range of critical temperatures; removing a portion of the outer superconductive layer to form at least one structure from the outer superconductive layer; placing at least part of the at least one structure formed from the outer superconductive layer in an electrolytic solution; and passing an electric current through an electrical circuit including the electrolytic solution and the at least part of the at least one structure formed from the outer superconductive layer, the at least part of the at least one structure being an anode of the electrical circuit.

Removing the portion of the layer may leave at least one artifact, and placing at least part of the at least one structure formed from the outer superconductive layer in the electrolytic solution may include placing at least part of the at least one structure formed from the outer superconductive layer that includes the at least one artifact in the electrolytic solution. Removing the portion of the outer superconductive layer may leave at least one artifact at the base of the at least one structure, and placing at least part of the at least one structure formed from the outer superconductive layer in the electrolytic solution may include placing the base of the at least one structure formed from the outer superconductive layer in the electrolytic solution. Removing the portion of the outer superconductive layer may include reactive-ion etching the portion of the outer superconductive layer to form a junction that extends from the oxide layer and which has at least one exposed peripheral surface. Passing the electric current through the electrical circuit including the electrolytic solution and the at least part of the at least one structure formed from the outer superconductive layer may be performed after placing the at least part of the at least one structure formed from the outer superconductive layer in the electrolytic solution. Placing at least part of the at least one structure formed from the outer superconductive layer in the electrolytic solution may include placing one or more lateral surfaces of the at least one structure in the electrolytic solution. The method may further include: forming a mask layer on an exposed surface of the outer junction layer, wherein placing at least part of the at least one structure formed from the outer superconductive layer in the electrolytic solution includes placing at least part of the outer superconductive layer on which the mask layer is not formed in the electrolytic solution. Placing at least part of the at least one structure formed from the outer superconductive layer in an electrolytic solution may include placing one or more portions of the outer superconductive layer disposed between the mask layer and the oxide layer in the electrolytic solution. Depositing the inner superconductive layer may include depositing a layer of aluminum or niobium; depositing the outer superconductive layer may include depositing a layer of niobium; and forming the oxide layer may include forming a layer of aluminum oxide or niobium oxide.

A method of fabricating a Josephson junction may be summarized as including: depositing an inner superconductive layer on at least part of the dielectric layer, the inner superconductive layer comprising a material that is superconductive in a range of critical temperatures; forming an oxide layer to overlie at least part of the inner superconductive layer; depositing an outer superconductive layer to overlie at least part of the oxide layer, the inner superconductive layer comprising a material that is superconductive in a range of critical temperatures; removing a portion of the outer superconductive layer to form at least one structure from the outer superconductive layer; heating at least part of the at least one structure formed from the outer superconductive layer; and placing the at least part of the at least one structure formed from the outer superconductive layer in a chamber containing a gas that includes nitrogen or in a solution that includes nitrogen to passivate an artifact, if any, left from removing the portion of the outer superconductive layer.

Placing the at least part of the at least one structure formed from the outer superconductive layer in the chamber containing the gas that includes nitrogen or in the solution that includes nitrogen may include placing the at least part of the at least one structure in the chamber containing the gas that includes nitrogen. Placing the at least part of the at least one structure formed from the outer superconductive layer in the chamber containing the gas that includes nitrogen may include placing the at least part of the at least one structure formed from the outer superconductive layer in the chamber containing the gas that includes nitrogen comprising ammonia. Placing the at least part of the at least one structure formed from the outer superconductive layer in the chamber containing the gas that includes nitrogen or in the solution that includes nitrogen may include placing the at least part of the at least one structure formed from the outer superconductive layer in the solution that includes nitrogen. Placing the at least part of the at least one structure formed from the outer superconductive layer in the solution that includes nitrogen may include placing the at least part of the at least one structure formed from the outer superconductive layer in the solution that includes nitrogen comprising a cyanide salt. Removing the portion of the outer superconductive layer may leave at least one artifact, and placing the at least part of the at least one structure formed from the outer superconductive layer in the chamber containing the gas that includes nitrogen or in the solution that includes nitrogen may passivate the at least one artifact. Removing the portion of the outer superconductive layer may leave at least one artifact at the base of the at least one structure, and placing the at least part of the at least one structure formed from the outer superconductive layer in the chamber containing the gas that includes nitrogen or in the solution that includes nitrogen may include placing at least part of the at least one structure formed from the outer superconductive layer that includes the at least one artifact in the chamber containing the gas that includes nitrogen or in the solution that includes nitrogen. Removing the portion of outer superconductive layer may include reactive-ion etching the portion of outer superconductive layer to form a junction that extends from the oxide layer and which has at least one exposed peripheral surface. Placing the at least part of the at least one structure formed from the outer superconductive layer in the chamber containing the gas that includes nitrogen or in the solution that includes nitrogen may include placing at least part of the at least one structure formed from the outer superconductive layer that includes the junction in the chamber containing the gas that includes nitrogen or in the solution that includes nitrogen. Placing the at least part of the at least one structure formed from the outer superconductive layer in the chamber containing the gas that includes nitrogen or in the solution that includes nitrogen may include placing one or more lateral surfaces of the at least one structure formed from the second superconductive layer in the chamber containing the gas that includes nitrogen or in the solution that includes nitrogen. The method may further include: forming a mask layer on an exposed surface of the outer superconductive layer, wherein placing the at least part of the at least one structure formed from the outer superconductive layer in the chamber containing the gas that includes nitrogen or in the solution that includes nitrogen includes placing one or more portions of the outer superconductive layer on which the mask layer is not formed in the chamber containing the gas that includes nitrogen or in the solution that includes nitrogen. Placing one or more portions of the outer superconductive layer on which the mask layer is not formed in the chamber containing the gas that includes nitrogen or in the solution that includes nitrogen may include placing one or more portions of the outer layer disposed between the mask layer and the oxide layer in the chamber containing the gas that includes nitrogen or in the solution that includes nitrogen. Depositing the inner superconductive layer may include depositing a layer of aluminum or niobium; depositing the outer superconductive layer may include depositing a layer of niobium; and forming the oxide layer may include forming a layer of aluminum oxide or niobium oxide.

A Josephson junction may be summarized as including: an inner superconductive layer, the inner superconductive layer comprising a material that is superconductive in a range of critical temperatures; a first oxide layer that overlies at least part of the inner superconductive layer; a superconductive structure that overlies at least part of the oxide layer, the superconductive structure comprising a material that is superconductive in a range of critical temperatures; and a second oxide layer or a nitride layer disposed on at least part of the superconductive structure, the second oxide layer or the nitride layer comprising an oxide or a nitride of a material of which the superconductive structure is comprised.

The superconductive structure may include one or more lateral surfaces, and the second oxide layer or the nitride layer may be disposed on at least part of the one or more lateral surfaces of the superconductive structure at the base of the superconductive structure. The superconductive structure may include one or more lateral surfaces that are nonconductive. The second oxide layer or the nitride layer may be disposed between an upper surface of the superconductive structure and the first oxide layer. The second oxide layer or the nitride layer may be disposed on one or more portions of the superconductive structure that are disposed outside a periphery of an upper surface of the superconductive structure. The one or more portions may be disposed between the upper surface of the superconductive structure and the first oxide layer. The inner superconductive layer may be comprised of aluminum or niobium; the superconductive structure may be comprised of niobium; the first oxide layer may be comprised of aluminum oxide or niobium oxide; and the second oxide layer or the nitride layer may be comprised of niobium oxide or niobium nitride. The Josephson junction may further include: a substrate; and a dielectric layer disposed on at least part of the substrate, wherein the inner superconductive layer is disposed over at least part of the dielectric layer. The substrate may be comprised of silicon; the dielectric layer may be comprised of silicon dioxide; the inner superconductive layer may be comprised of aluminum or niobium; the superconductive structure may be comprised of niobium; the first oxide layer may be comprised of aluminum oxide or niobium oxide; and the second oxide layer or the nitride layer may be comprised of niobium oxide or niobium nitride. The Josephson junction may further include: an intermediate superconductive layer comprising a material that is superconductive in a range of critical temperatures, wherein the intermediate superconductive layer is disposed on at least part of the inner superconductive layer. The inner superconductive layer and the superconductive structure may be comprised of niobium; the intermediate superconductive layer may be comprised of aluminum; the first oxide layer may be comprised of aluminum oxide; and the second oxide layer or the nitride layer may be comprised of niobium oxide or niobium nitride.

A method of fabricating a Josephson junction may be summarized as including depositing a first superconductive layer; depositing a second superconductive layer to overlie at least part of the first superconductive layer; forming an oxide layer to overlie at least part of the second superconductive layer at which the Josephson junction is being formed; depositing a first dielectric layer to overlie at least part of the oxide layer; removing a first portion of the first dielectric layer to form a cavity in the first dielectric layer that exposes a portion of the oxide layer; removing the exposed portion of the oxide layer, the exposed portion of the oxide layer formed over a first portion of the second superconductive layer; forming a new oxide portion in place of the removed exposed portion of the oxide layer to overlie at least part of the first portion of the second superconductive layer at which at least part of the Josephson junction is being formed; and depositing a third superconductive layer to overlie at least part of the first dielectric layer and at least part of the new oxide portion. Removing the first portion of the first dielectric layer may include shaping at least part of the first dielectric layer adjacent the first portion of the first dielectric layer such that a first sloped portion is formed adjacent the first portion of the first dielectric layer and a second sloped portion is formed adjacent the first portion of the first dielectric layer, the first sloped portion facing the second sloped portion.

The method may further include removing a portion of the third superconductive layer; removing a second portion of the first dielectric layer, the second portion of the first dielectric layer exposed by removing the portion of the third superconductive layer; and depositing a second dielectric layer to overlie at least part of the third superconductive layer and at least part of the oxide layer.

The method may further include planarizing the second dielectric layer.

The method may further include removing a first portion of the second dielectric layer; removing a second portion of the second dielectric layer; removing a third portion of the oxide layer, the third portion of the oxide layer exposed by removing the first portion of the second dielectric layer; removing a first portion of the second superconductive layer, the first portion of the second superconductive layer exposed by removing the third portion of the oxide layer; depositing a fourth superconductive layer to overlie at least part of the second dielectric layer, at least part of the first superconductive layer exposed by removing the first portion of the second superconductive layer, and at least part of the third superconductive layer exposed by removing the second portion of the second dielectric layer; and removing a portion of the fourth superconductive layer disposed between the first portion and the second portion of the second dielectric layer. Depositing the first superconductive layer may include depositing a layer of niobium; depositing the second superconductive layer may include depositing a layer of aluminum; depositing the third superconductive layer may include depositing a layer of niobium; forming the oxide layer may include forming a layer of aluminum oxide; forming the new oxide portion may include forming a portion of aluminum oxide; and depositing the first dielectric layer may include depositing at least one of a layer of silicon nitride and a layer of silicon dioxide.

The method may further include depositing a second dielectric layer to overlie a substrate, wherein depositing the first superconductive layer includes depositing the first superconductive layer to overlie at least part of the second dielectric layer.

The method may further include forming a vacuum in a chamber, wherein depositing the third superconductive layer is performed in the chamber without breaking the vacuum. Forming the oxide layer may include exposing at least part of the second superconductive layer to oxygen. Removing the first portion of the first dielectric layer may include reactive-ion etching at least part of the first dielectric layer. Removing the first portion of the oxide layer may include sputter etching at least part of the oxide layer.

Depositing the first superconducting layer and depositing the second superconducting layer to overlie at least part of the first superconductive layer may include depositing the first superconducting layer comprised of a first superconducting material and depositing the second superconducting layer comprised of the first superconducting material to overlie at least part of the first superconductive layer in a single sequence. Depositing the first superconducting layer comprised of the first superconducting material and depositing the second superconducting layer comprised of the first superconducting material to overlie at least part of the first superconductive layer in a single sequence may include depositing the first superconducting layer comprised of aluminum and depositing the second superconducting layer comprised of aluminum to overlie at least part of the first superconductive layer in a single sequence.

A method of fabricating a superconducting circuit may be summarized as including depositing a first dielectric layer; depositing a resistive layer to overlie at least part of the first dielectric layer; depositing a first superconductive layer to overlie at least part of the resistive layer and at least part of the first dielectric layer; depositing a second superconductive layer to overlie at least part of the first superconductive layer; forming an oxide layer to overlie at least part of the second superconductive layer at which at least part of a Josephson junction is being formed; depositing a second dielectric layer to overlie at least part of the oxide layer; removing a first portion of the second dielectric layer to form a cavity in the second dielectric layer that exposes a portion of the oxide layer; removing the exposed portion of the oxide layer, the exposed portion of the oxide layer formed over a first portion of the second superconductive layer; forming a new oxide portion in place of the removed exposed portion of the oxide layer to overlie at least part of the first portion of the second superconductive layer at which at least part of the Josephson junction is being formed; and depositing a third superconductive layer to overlie at least part of the second dielectric layer and at least part of the new oxide portion. Removing the first portion of the second dielectric layer may include shaping at least part of the second dielectric layer adjacent the first portion of the second dielectric layer such that a first sloped portion is formed adjacent the first portion of the second dielectric layer and a second sloped portion is formed adjacent the first portion, the first sloped portion facing the second sloped portion of the second dielectric layer.

The method may further include removing a portion of the third superconductive layer; removing a second portion of the second dielectric layer, the second portion of the second dielectric layer exposed by removing the portion of the third superconductive layer; removing a third portion of the oxide layer, the third portion of the oxide layer exposed by removing the second portion of the third superconductive layer; removing a first portion of the second superconductive layer, the first portion of the second superconductive layer exposed by removing the third portion of the oxide layer; removing a portion of the first superconductive layer, the portion of the first superconductive layer exposed by removing the first portion of the second superconductive layer; and depositing a third dielectric layer to overlie at least part of the oxide layer, at least part of the resistive layer, and at least part of the third superconductive layer.

The method may further include planarizing the third dielectric layer.

The method may further include removing a first portion of the third dielectric layer; removing a second portion of the third dielectric layer; removing a fourth portion of the oxide layer, the fourth portion of the oxide layer exposed by removing the first portion of the third dielectric layer; removing a second portion of the second superconductive layer, the second portion of the second superconductive layer exposed by removing the first portion of the fourth portion of the oxide layer; and depositing a fourth superconductive layer to overlie at least part of the third dielectric layer, at least part of the first superconductive layer exposed by removing the second portion of the second superconductive layer, and at least part of the third superconductive layer exposed by removing the second portion of the third dielectric layer.

Depositing the first superconductive layer may include depositing a layer of niobium; depositing the second superconductive layer may include depositing a layer of aluminum; depositing the third superconductive layer may include depositing a layer of niobium; forming the oxide layer may include forming a layer aluminum oxide; forming the new oxide portion may include forming a portion aluminum oxide; depositing the first dielectric layer may include depositing a layer of silicon dioxide; and depositing the second dielectric layer may include depositing at least one of a layer of silicon nitride and a layer of silicon dioxide.

Depositing the first dielectric layer may include depositing the first dielectric layer to overlie at least part of a substrate.

The method may further include forming a vacuum in a chamber, wherein depositing the third superconductive layer is performed in the chamber without breaking the vacuum. Forming the oxide layer may include exposing at least part of the second superconductive layer to oxygen. Removing the first portion of the second dielectric layer may include reactive-ion etching at least part of the second dielectric layer. Removing the first portion of the oxide layer may include sputter etching at least part of the oxide layer.

A method of fabricating a superconducting circuit may be summarized as including depositing a first dielectric layer to overlie at least part of a substrate; depositing a resistive layer to overlie at least part of the first dielectric layer; removing at least part of the resistive layer; depositing a first superconductive layer; depositing a second superconductive layer to overlie at least part of the first superconductive layer; forming an oxide layer to overlie at least part of the second superconductive layer at which at least part of a Josephson junction is being formed; depositing a second dielectric layer to overlie at least part of the oxide layer; removing a first portion of the second dielectric layer; removing a first portion of the oxide layer, the first portion of the oxide layer formed over a first portion of the second superconductive layer; forming a second portion of the oxide layer to overlie at least part of the first portion of the second superconductive layer at which at least part of the Josephson junction is being formed; depositing a third superconductive layer to overlie at least part of the second dielectric layer and at least part of the second portion of the oxide layer, the depositing of the third superconductive layer including forming a vacuum and depositing the third superconductive layer to overlie at least part of the second dielectric layer and at least part of the second portion of the oxide layer without breaking the vacuum; removing a portion of the third superconductive layer; removing a second portion of the second dielectric layer, the second portion of the second dielectric layer exposed by removing the portion of the third superconductive layer; removing a third portion of the oxide layer, the third portion of the oxide layer exposed by removing the second portion of the third superconductive layer; removing a first portion of the second superconductive layer, the first portion of the second superconductive layer exposed by removing the third portion of the oxide layer; removing a portion of the first superconductive layer, the portion of the first superconductive layer exposed by removing the first portion of the second superconductive layer; depositing a third dielectric layer to overlie at least part of the third superconductive layer, at least part of the resistive layer, and at least part of the oxide layer; planarizing the third dielectric layer; removing a first portion of the third dielectric layer; removing a second portion of the third dielectric layer; removing a third portion of the oxide layer, the third portion of the oxide layer exposed by removing the first portion of the third dielectric layer; removing a first portion of the second superconductive layer, the first portion of the second superconductive layer exposed by removing the third portion of the oxide layer; depositing a fourth superconductive layer to overlie at least part of the third dielectric layer, at least part of the first superconductive layer exposed by removing the first portion of the second superconductive layer, and at least part of the third superconductive layer exposed by removing the second portion of the third dielectric layer; and removing at least part of the fourth superconductive layer. Depositing the first superconductive layer may include depositing a layer of niobium; depositing the second superconductive layer may include depositing a layer of aluminum; depositing the third superconductive layer may include depositing a layer of niobium; forming the oxide layer may include forming a layer of aluminum oxide; forming the new oxide portion may include forming a portion of aluminum oxide; depositing the first dielectric layer may include depositing a layer of silicon dioxide; and depositing the second dielectric layer may include depositing at least one of a layer of silicon nitride and a layer of silicon dioxide; and depositing the third dielectric layer may include depositing a layer of silicon dioxide. Forming the oxide layer may include exposing at least part of the second superconductive layer to oxygen. Removing the first portion of the second dielectric layer may include reactive-ion etching at least part of the second dielectric layer. Removing the first portion of the oxide layer may include sputter etching at least part of the oxide layer.

A superconducting circuit may be summarized as including a first superconductive layer; a second superconductive layer disposed over at least part of the first superconductive layer; an oxide layer disposed over at least part of the second superconductive layer, the oxide layer including a first portion having a first thickness, a second portion having a second thickness, and a third portion having the second thickness, the first portion interposed between the second portion and the third portion; a first dielectric portion disposed over the second portion of the oxide layer; a second dielectric portion disposed over the third portion of the oxide layer, at least part of the second dielectric portion laterally spaced apart from the first dielectric portion; and a third superconductive layer disposed over at least part of the first portion of the oxide layer and at least part of the first and the second dielectric portions, at least part of the third superconductive layer interposed between the first dielectric portion and the second dielectric portion. The first dielectric portion may include a first sloped portion adjacent the second dielectric layer, at least part of the third superconductive layer disposed over the first sloped portion; and the second dielectric portion may include a second sloped portion adjacent the first dielectric portion, at least part of the third superconductive layer disposed over the second sloped portion.

The superconducting circuit may further include a third dielectric layer over which at least part of the first superconductive layer is disposed; and a resistive layer disposed over at least part of the third dielectric layer, the resistive layer electrically coupled to the first superconductive layer.

The superconducting circuit may further include a third dielectric layer disposed over at least part of the third superconductive layer and at least part of the oxide layer; a fourth superconductive layer, the fourth superconductive layer disposed over at least part of the third dielectric layer and electrically coupled to the first superconductive layer; and a fifth superconductive layer, the fifth superconductive layer disposed over at least part of the third dielectric layer and electrically coupled to the third superconductive layer.

The first superconductive layer and the third superconductive layer may be comprised of niobium; the second superconductive layer may be comprised of aluminum; the oxide layer may be comprised of aluminum oxide; and the first dielectric portion and the second dielectric portion may be comprised of at least one of silicon nitride and silicon dioxide. The first portion of the oxide layer may be a quantum tunneling barrier.

A superconducting circuit may be summarized as including a first superconductive layer; a second superconductive layer disposed over at least part of the first superconductive layer; a first oxide layer disposed over at least part of the second superconductive layer; a first dielectric layer disposed over at least part of the first oxide layer, the first dielectric layer including a cavity disposed over a first portion of the first oxide layer that has been removed from a first portion of the second superconductive layer; a second oxide layer disposed over at least part of the first portion of the second superconductive layer, the second oxide layer part of a Josephson junction; and a third superconductive layer disposed over at least part of the first dielectric layer and at least part of the second oxide layer, at least part of the third superconductive layer at least partially filling the cavity included in the first dielectric layer. The first dielectric layer may include a first sloped portion adjacent the cavity, at least part of the third superconductive layer disposed over the first sloped portion; and the first dielectric layer may include a second sloped portion adjacent the cavity, at least part of the third superconductive layer disposed over the second sloped portion.

The superconducting circuit may further include a third dielectric layer over at least part of the first superconductive layer is disposed; and a resistive layer disposed over at least part of the third dielectric layer, the resistive layer electrically coupled to the first superconductive layer.

The superconducting circuit may further include a third dielectric layer disposed over at least part of the third superconductive layer and at least part of the first oxide layer; a fourth superconductive layer, the fourth superconductive layer disposed over at least part of the third dielectric layer and electrically coupled to the first superconductive layer; and a fifth superconductive layer, the fifth superconductive layer disposed over at least part of the third dielectric layer and electrically coupled to the third superconductive layer. The first superconductive layer and the third superconductive layer may be comprised of niobium; the second superconductive layer may be comprised of aluminum; the first oxide layer may be comprised of aluminum oxide; the second oxide layer may be comprised of aluminum oxide; and the first dielectric layer may be comprised of at least one of silicon nitride and silicon dioxide. The second oxide layer may be a quantum tunneling barrier.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

DETAILED DESCRIPTION

Figure 1:
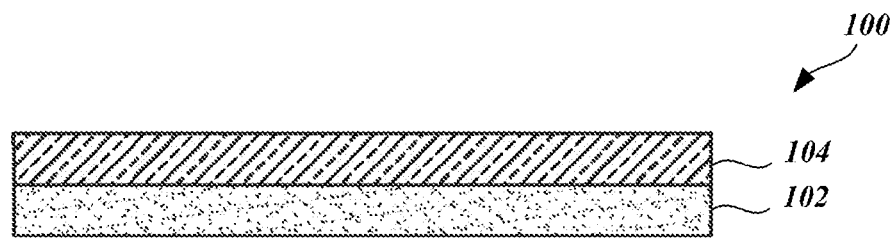
FIG. 1 is a cross-sectional representation of a superconducting integrated circuit at a phase of a fabrication process, according to one illustrated embodiment.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with superconductive circuits or structures, quantum computer circuits or structures and/or fabrication tools and processes have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The headings and Abstract of the Disclosure provided herein are for convenience only and do not interpret the scope or meaning of the embodiments.

Unless the specific context requires otherwise, throughout this specification the terms "deposit," "deposited," "deposition," and the like are generally used to encompass any method of material deposition, including but not limited to physical vapor deposition (PVD), chemical vapor deposition (CVD), plasma-enhanced PVD, plasma-enhanced CVD, and atomic layer deposition (ALD).

The various embodiments described herein provide systems and methods for fabricating superconducting integrated circuits. As previously described, in the art superconducting integrated circuits tend to be fabricated in research environments outside of state-of-the-art semiconductor fabrication facilities, even though superconducting integrated circuits are typically fabricated using many of the same tools and techniques that are traditionally used in the semiconductor fabrication industry. Due to issues unique to superconducting circuits, semiconductor processes and techniques generally need to be modified for use in superconductor chip and circuit fabrication. Such modifications typically are not obvious and may require some experimentation.

Fabrication of Low Spread Josephson Junctions

It can be desirable to form low-spread Josephson junctions so that each junction within a chip functions similarly to other junctions in the chip. That is, the low-spread junctions have low variability or variance. Integrated circuit fabrication process variations can introduce imperfections or artifacts to geometrically designed structures. For example, semiconductor processes commonly used for making Josephson junctions, such as lithographic patterning and reactive-ion etching, can introduce unwanted geometric imperfections or artifacts that cause non-uniformity among Josephson junctions known as junction spread. Accordingly, it can be desirable to establish a method that minimizes junction spread among Josephson junctions.

Figure 11:
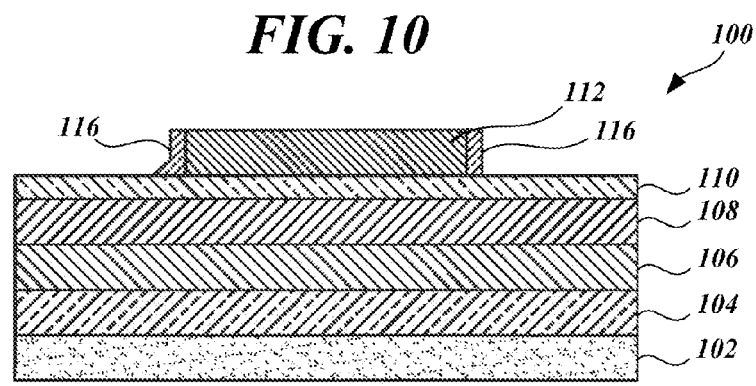
FIG. 11 is a cross-sectional representation of a superconducting integrated circuit at a phase of a fabrication process, according to one illustrated embodiment.
Figure 12:
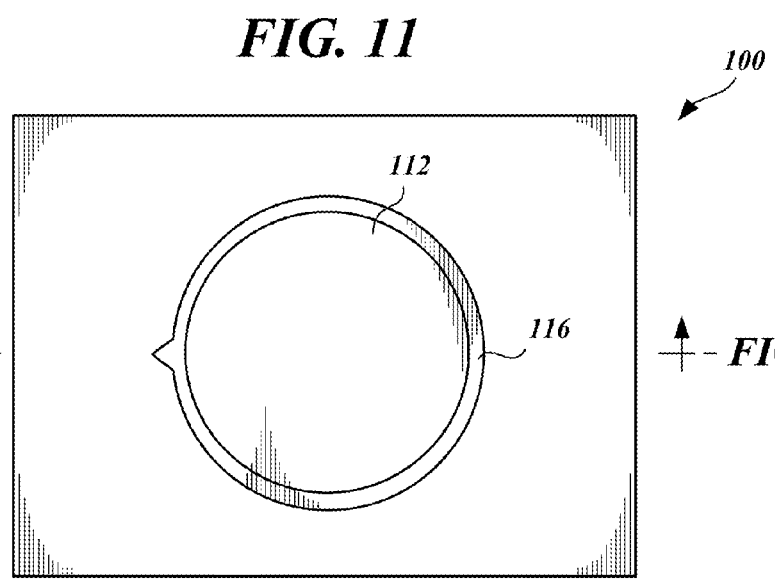
FIG. 12 is a top plan view of the superconducting integrated circuit shown in FIG. 11.
Figure 13:
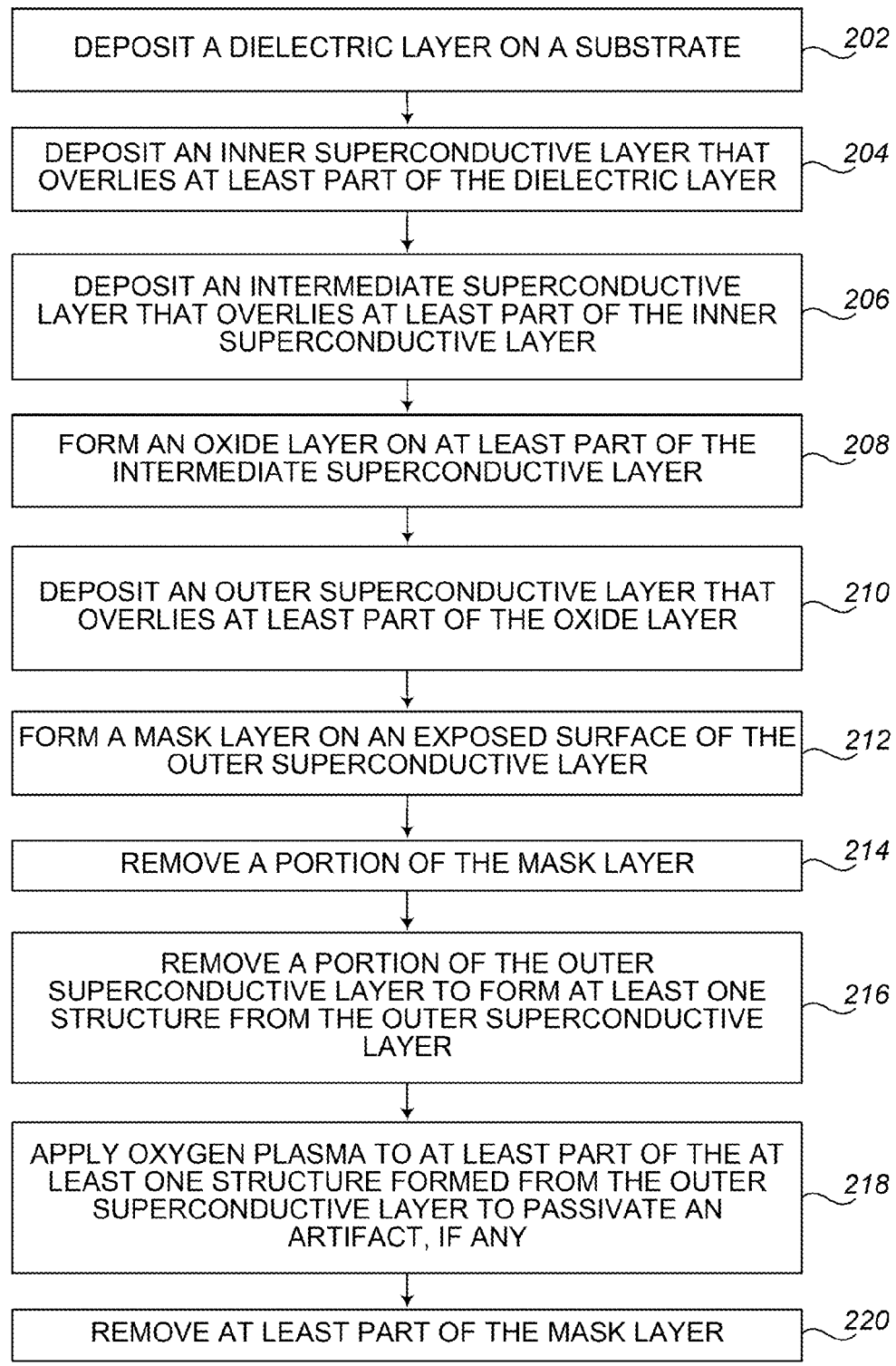
FIG. 13 shows a fabrication method to produce the structures illustrated in FIGS. 1-12, according to one illustrated embodiment.

FIGS. 1-12 are representations of formation of an integrated circuit 100 at different subsequent phases of a fabrication process, according to one illustrated embodiment. FIG. 13 shows a fabrication method to produce the intermediate and end structures illustrated in FIGS. 1-12, according to one illustrated embodiment.

The integrated circuit 100 includes at least a substrate, an inner superconducting layer, an outer superconducting layer, and optionally one or more intermediate superconducting layers. The term inner is used to denominate that the respective superconducting layer is spaced relatively inward of the outer superconducting layer with respect to the substrate. The term outer is used to denominate that the respective superconducting layer is spaced relatively outward of the inner superconducting layer with respect to the substrate. The term intermediate is used to denominate that the respective superconducting layer is spaced between the inner and the outer superconducting layers.

The method may be used to fabricate a niobium (Nb) based Josephson junction. In one embodiment, superconducting integrated circuit fabrication processes, such as lithographic pattern definition and Reactive-Ion Etching (RIE), are followed by a novel act of applying oxygen plasma to oxidize small niobium (Nb) imperfections or artifacts that contribute to junction spread. The oxygen plasma turns the niobium imperfections or artifacts into niobium-oxide imperfections or artifacts, which are non-conductive in nature and therefore do not contribute to junction spread.

Referring now to FIGS. 1 and 13, semiconductor fabrication equipment deposits a dielectric layer 104 over (e.g., on) at least part of a substrate 102 at 202. For example, the semiconductor fabrication equipment employs a CVD process to deposit the dielectric layer 104 on the substrate 102. In one embodiment, the substrate 102 is comprised of silicon and the first dielectric layer 104 is comprised of silicon dioxide. In one embodiment, semiconductor fabrication equipment planarizes the first dielectric layer 104 at 202. For example, the semiconductor fabrication equipment employs a CMP process to planarize the first dielectric layer 104.

If the substrate 102 is formed from a non-conductive material (e.g., sapphire), it may not be desirable to form the first dielectric layer 104 at 202. Accordingly, in at least one implementation, the acts described above in connection with 202 are not performed.

Figure 2:
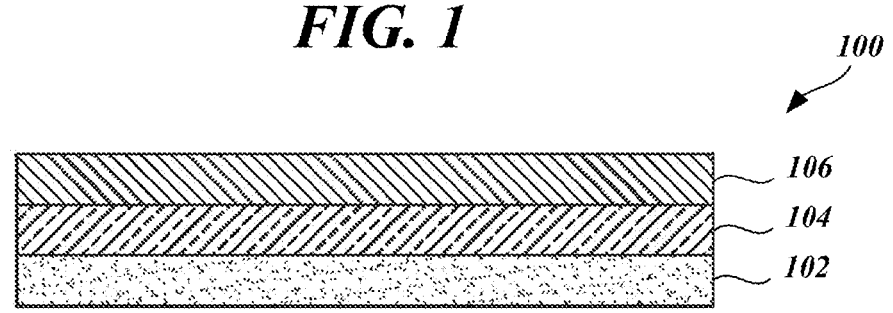
FIG. 2 is a cross-sectional representation of a superconducting integrated circuit at a phase of a fabrication process, according to one illustrated embodiment.

At 204, semiconductor fabrication equipment deposits an inner superconductive layer 106 that superconducts in a range of critical temperatures over (e.g., on) at least part of the dielectric layer 104, as shown in FIG. 2. For example, the semiconductor fabrication equipment employs a CVD process to deposit the inner superconductive layer 106 on the dielectric layer 104. In one embodiment, the inner superconductive layer 106 is comprised of niobium. In one embodiment, semiconductor fabrication equipment planarizes the inner superconductive layer 106 at 204. For example, the semiconductor fabrication equipment employs a CMP process to planarize the inner superconductive layer 106.

Figure 3:
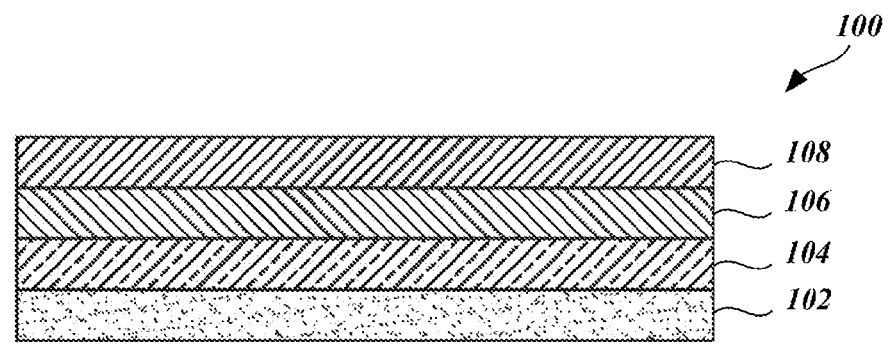
FIG. 3 is a cross-sectional representation of a superconducting integrated circuit at a phase of a fabrication process, according to one illustrated embodiment.

At 206, semiconductor fabrication equipment deposits an intermediate superconductive layer 108 that superconducts in a range of critical temperatures over at least part of the inner superconductive layer 106, as shown in FIG. 3. For example, the semiconductor fabrication equipment employs a CVD process to deposit the intermediate superconductive layer 108 on the inner superconductive layer 106. In one embodiment, the intermediate superconductive layer 108 is comprised of aluminum (Al). In one embodiment, semiconductor fabrication equipment planarizes the intermediate superconductive layer 108 at 206. For example, the semiconductor fabrication equipment employs a CMP process to planarize the intermediate superconductive layer 108. In at least one implementation, the acts described above in connection with 206 are not performed. That is, the intermediate superconductive layer 108 is optional in one or more implementations.

Figure 4:
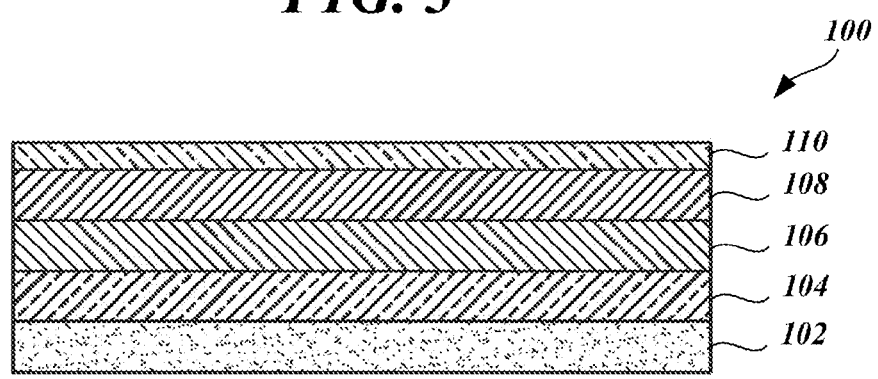
FIG. 4 is a cross-sectional representation of a superconducting integrated circuit at a phase of a fabrication process, according to one illustrated embodiment.

At 208, semiconductor fabrication equipment forms an oxide layer 110 on the intermediate superconductive layer 108, as shown in FIG. 4. The semiconductor fabrication equipment may form the oxide layer 110 by exposing the intermediate superconductive layer 108 to a predetermined concentration of oxygen gas for a predetermined amount of time at a predetermined temperature and a predetermined pressure to form a desired thickness of the oxide layer 110. In one embodiment, the oxide layer 110 is comprised of aluminum oxide (i.e., $Al_2O_3$). In one implementation, the concentration of oxygen gas used to form the oxide layer 110 at 208 is 100% pure oxygen. The oxidation time may be in a range from one minute to hundreds of minutes at room temperature, at a pressure that may range from milli-Torr to tens of Torrs. The desired thickness of the oxide layer 110 can be on the order of a few angstroms to tens of angstroms. In some embodiments, the desired thickness is in the range of about ten angstroms to two hundred angstroms. In some embodiments, the desired thickness is less than one hundred angstroms.

Figure 5:
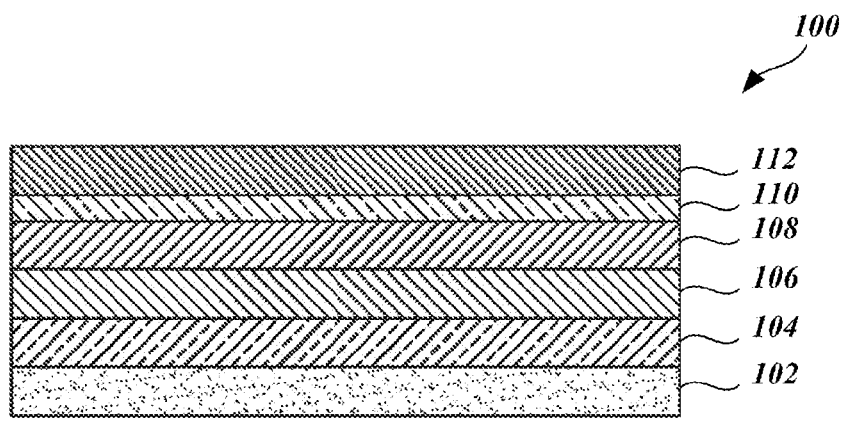
FIG. 5 is a cross-sectional representation of a superconducting integrated circuit at a phase of a fabrication process, according to one illustrated embodiment.

If the acts described above in connection with 206 are not performed (i.e., the intermediate superconductive layer 108 is not formed), the semiconductor fabrication equipment forms the oxide layer 110 on the inner superconductive layer 106 at 208. Accordingly, in one implementation the oxide layer 110 is comprised of niobium oxide (e.g., NbO, $NbO_2$, or $Nb_2O_5$). At 210, semiconductor fabrication equipment deposits an outer superconductive layer 112, that superconducts in a range of critical temperatures, over (e.g., on) at least part of the oxide layer 110, as shown in FIG. 5. For example, the semiconductor fabrication equipment employs a CVD process to deposit the outer superconductive layer 112 on the oxide layer 110. In one embodiment, the outer superconductive layer 112 is comprised of niobium. In one embodiment, semiconductor fabrication equipment planarizes the outer superconductive layer 112 at 210. For example, the semiconductor fabrication equipment employs a CMP process to planarize the outer superconductive layer 112.

Figure 6:
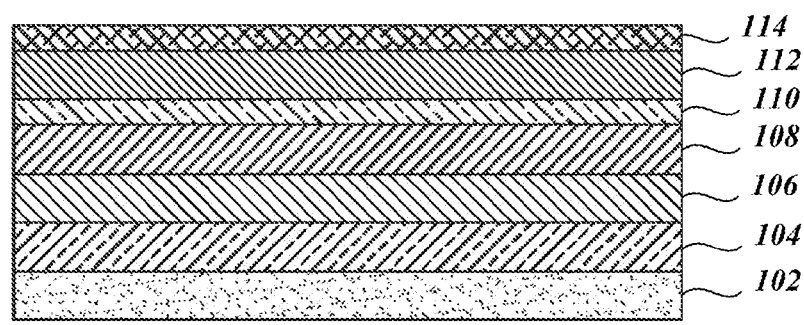
FIG. 6 is a cross-sectional representation of a superconducting integrated circuit at a phase of a fabrication process, according to one illustrated embodiment.

At 212, semiconductor fabrication equipment forms a mask layer 114 over (e.g., on) at least part of the outer superconductive layer 112, as shown in FIG. 6. For example, the semiconductor fabrication equipment deposits a photoresist material on an upper surface of the outer superconductive layer 112 and then selectively irradiates desired portions of the photoresist material to form the mask layer 114.

Figure 7:
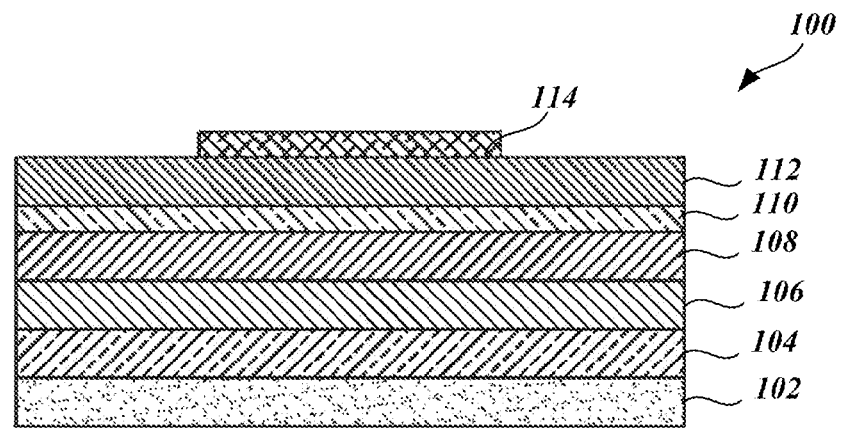
FIG. 7 is a cross-sectional representation of a superconducting integrated circuit at a phase of a fabrication process, according to one illustrated embodiment.

At 214, semiconductor fabrication equipment removes a portion of the mask layer 114, as shown in FIG. 7. For example, the semiconductor fabrication equipment washes away a portion of the photoresist material that was not irradiated with UV light at 212 using a developer fluid.

Figure 8:
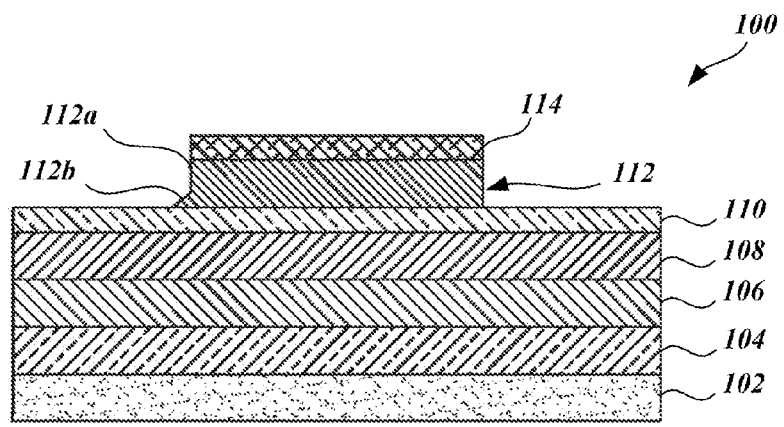
FIG. 8 is a cross-sectional representation of a superconducting integrated circuit at a phase of a fabrication process, according to one illustrated embodiment.
Figure 9:
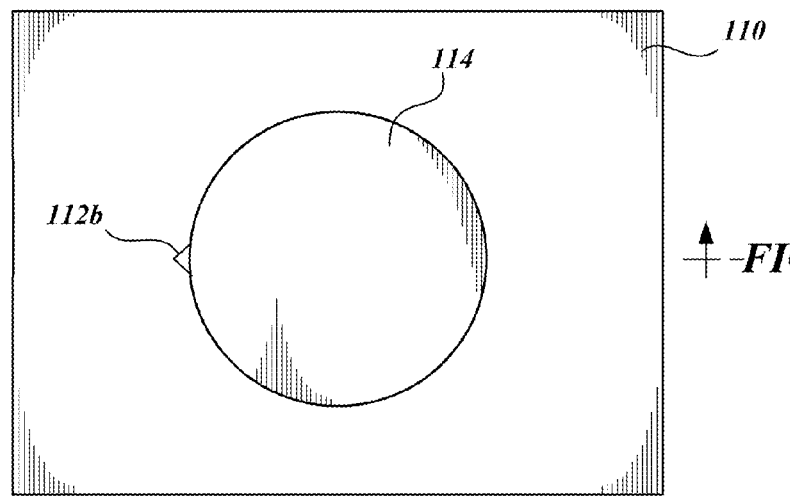
FIG. 9 is a top plan view of the superconducting integrated circuit shown in FIG. 8.

At 216, semiconductor fabrication equipment removes a portion of the outer superconductive layer 112 to form a structure (e.g., a junction) from the outer superconductive layer 112, as shown in FIG. 8. For example, the semiconductor fabrication equipment performs a Reactive-Ion Etching (RIE) process, which employs chemically-reactive plasma, to remove a portion of the outer superconductive layer 112 stopping at the oxide layer 110. As shown in FIG. 8, the structure formed from the outer superconductive layer 112 includes at least one exposed lateral surface 112*a* and an artifact 112*b*. For example, the artifact 112*b* may be created at the base of the structure formed from the outer superconductive layer 112 during the RIE process. For illustrative simplicity, only one artifact 112*b* is shown in FIGS. 8 and 9; however, a plurality of artifacts 112*b* may be formed at a plurality of locations on the structure formed from the outer superconductive layer 112.

Figure 10:
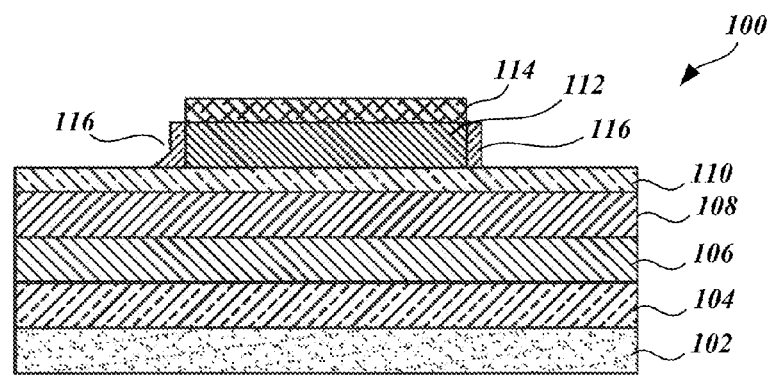
FIG. 10 is a cross-sectional representation of a superconducting integrated circuit at a phase of a fabrication process, according to one illustrated embodiment.

At 218, semiconductor fabrication equipment applies oxygen plasma to at least part of the structure formed from the outer superconductive layer 112 to passivate the artifact 112*b*. That is, the artifact 112*b* and other portions of the outer superconductive layer 112 to which the oxygen plasma is applied are converted into a nonconductive metallic oxide 116, as shown in FIGS. 10-12. Passivation of the artifact using a nonconductive metallic oxide, such as described above, can reduce noise.

The semiconductor fabrication equipment may generate the oxygen plasma for a predetermined amount of time in an environment that contains a predetermined concentration of oxygen gas and that is at a predetermined temperature and a predetermined pressure to form a desired thickness of the metallic oxide 116. For example, if the outer superconductive layer 112 is comprised of niobium, the oxygen plasma transforms the artifact 112*b* into niobium oxide (e.g., NbO, $NbO_2$, or $Nb_2O_5$), which does not conduct electricity. As shown in FIG. 12, the nonconductive metallic oxide 116, which correspond to the portions of the outer superconductive layer 112 to which the oxygen plasma was applied, is disposed outside a periphery of an upper surface of the structure formed from the outer superconductive layer 112.

The semiconductor fabrication equipment may generate the oxygen plasma at 218 using 100% pure oxygen gas. Alternatively, the semiconductor fabrication equipment may generate the oxygen plasma using a mixture of an inert carrier gas (e.g., argon) and oxygen gas, wherein the concentration of oxygen gas may vary from a few percent to slightly less than one hundred percent, for example. The semiconductor fabrication equipment may generate the oxygen plasma in a temperature range between 100° C. and 250° C., for example. The semiconductor fabrication equipment may generate the oxygen plasma at a power level in a range from a few hundred Watts to a thousand Watts, for example, depending on the configuration of the equipment. The semiconductor fabrication equipment may generate the oxygen plasma for a period of time that ranges from 30 seconds to 300 seconds, for example.

At 218, semiconductor fabrication equipment may passivate the artifact 112*b* using an anodizing process, without applying oxygen plasma to the structure formed from the outer superconductive layer 112. For example, at least part of the structure formed from the outer superconductive layer 112 may be placed in an electrolytic solution and semiconductor fabrication equipment may create an electrical circuit in which the outer superconductive layer 112 forms the anode electrode of the electric circuit. The semiconductor fabrication equipment then passes an electric current through the electrolytic solution that causes an oxide layer to form on at least part of the structure formed from the outer superconductive layer 112.

For example, the anodizing process performed at 218 may employ an electrolytic solution of nitric acid with a concentration ranging between 1% and 99%, for example. The anodizing process may be performed in a range of temperatures, for example, from room temperature to over 100° C., depending on the concentration of the electrolytic solution. The magnitude of current used in the anodizing process may depend on the exposed surface area of the structure formed from the outer superconductive layer 112, wherein a relatively larger exposed surface area typically requires a greater magnitude of current than a relatively smaller exposed surface area.

At 218, semiconductor fabrication equipment may passivate the artifact 112*b* using a nitriding process, without applying oxygen plasma to the structure formed from the outer superconductive layer 112. For example, at least part of the structure formed from the outer superconductive layer 112 may be heated in a chamber containing a nitrogen rich gas, such as ammonia. When the gas comes into contact with the structure formed from the heated superconductive layer 112, nitrogen diffuses onto the surface of the superconductive layer 112 creating niobium nitride (i.e., NbN). By way of another example, semiconductor fabrication equipment may heat the structure formed from the outer superconductive layer 112 in a salt bath that includes a nitrogen-containing salt, such as cyanide salt, which causes nitrogen from the salt to form niobium nitride on the superconductive layer 112 and passivate the artifact 112*b*. By way of yet another example, semiconductor fabrication equipment may apply nitrogen plasma to at least part of the structure formed from the outer superconductive layer 112 to form niobium nitride on the artifact 112*b*, thereby passivating it. Passivation of the artifact using a nitride layer, as described above, can reduce noise. Even though the nitride layer can be conductive, the nitride layer can bind free electrons that could otherwise be a source of noise.

In one implementation, the semiconductor fabrication equipment employs a nitriding process at 218 in which nitrogen plasma is applied the superconductive layer 112 to passivate the artifact 112b. The semiconductor fabrication equipment may generate the nitrogen plasma using 100% pure nitrogen gas. Alternatively, the semiconductor fabrication equipment may generate the nitrogen plasma using an ammonia and nitrogen gas mixture, wherein the concentration of ammonia may range between 1% and 50%, for example. The semiconductor fabrication equipment may generate the nitrogen plasma in a range of temperatures, for example, from room temperature to 200° C. In one implementation, the semiconductor fabrication equipment employs a thermal nitriding process at 218, without generating nitrogen plasma, using chemistry similar that described above, except that the temperature may elevated up to a few hundreds degrees Celsius, for example, 800° C., limited only by device physics requirements. For example, some devices do not exhibit desirable physical behavior if heated about a certain temperature, for longer than a certain temperature, or a combination of temperature and time.

At 220, semiconductor fabrication equipment removes at least part of the mask layer 114 from the structure formed from the outer superconductive layer 112, as shown in FIGS. 11 and 12. For example, the semiconductor fabrication equipment strips the mask layer 114 from the outer superconductive layer 112 using a reagent.

The resulting integrated circuit 100 includes a Josephson junction comprising the inner superconductive layer 106, the intermediate superconductive layer 108, the oxide layer 110, the structure formed from the outer superconductive layer 112, and the nonconductive metallic oxide 116. The Josephson junction has significantly less junction spread than Josephson junctions fabricated using conventional fabrication methods. In one experiment, a batch of Josephson junctions having a junction diameter of 2 micrometers not fabricated using the method had a mean junction spread as a percentage of junction diameter of 1.114 and a standard deviation of 1.681; whereas, a batch of Josephson junctions having a junction diameter of 2 micrometers fabricated using the method had a mean junction spread as a percentage of junction diameter of 0.658 and a standard deviation of 0.646. In another experiment, a batch of Josephson junctions having a junction diameter of 0.6 micrometer not fabricated using the method had a mean junction spread as a percentage of junction diameter of 3.186 and a standard deviation of 1.945; whereas, a batch of Josephson junctions having a junction diameter of 0.6 micrometer fabricated using the method had a mean junction spread as a percentage of junction diameter of 2.026 and a standard deviation of 1.310.

Fabrication of Ultra-Small Josephson Junctions

It can be desirable to form Josephson junctions having ultra-small junction sizes (e.g., junctions having sub-micron dimensions) for numerous applications. One of many advantageous characteristics that Josephson junctions having ultra-small junction sizes may provide is reduced junction capacitance. Using conventional techniques for forming Josephson junctions, it can be difficult to make contact with Josephson junctions having ultra-small junction sizes.

Contact via dimensions required by prior art methods becomes excessively small such that via performance may be compromised. Other conventional techniques (e.g., self-aligning methods using chemical-mechanical planarization or polishing) have been known to degrade the quality of Josephson junctions because such methods introduce high mechanical stresses to the junction during processing.

Accordingly, it can be desirable to form Josephson junctions having ultra-small junction sizes without one or more of the aforementioned shortcomings of conventional techniques. The presently disclosed methods may be used to form Josephson junctions having ultra-small junction sizes (e.g., less than one-quarter of a micrometer). Such methods may be compatible with conventional semiconductor fabrication systems. Additionally, Josephson junctions formed by such methods may have relatively large contact points and may be self-protected.

Figure 14A:
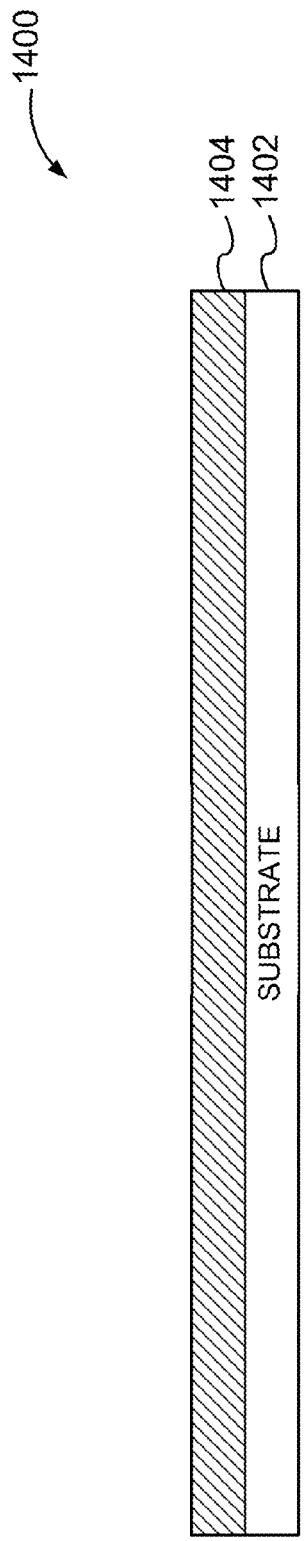
FIGS. 14A-14U are cross-sectional representations of a superconducting integrated circuit at different phases of a fabrication process, according to one illustrated embodiment.
Figure 14B:
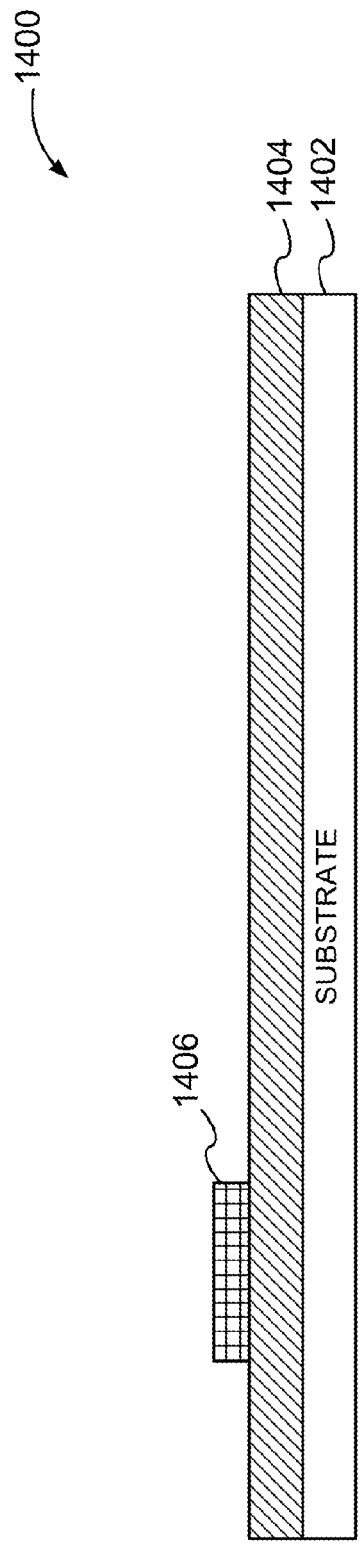
Figure 14E:
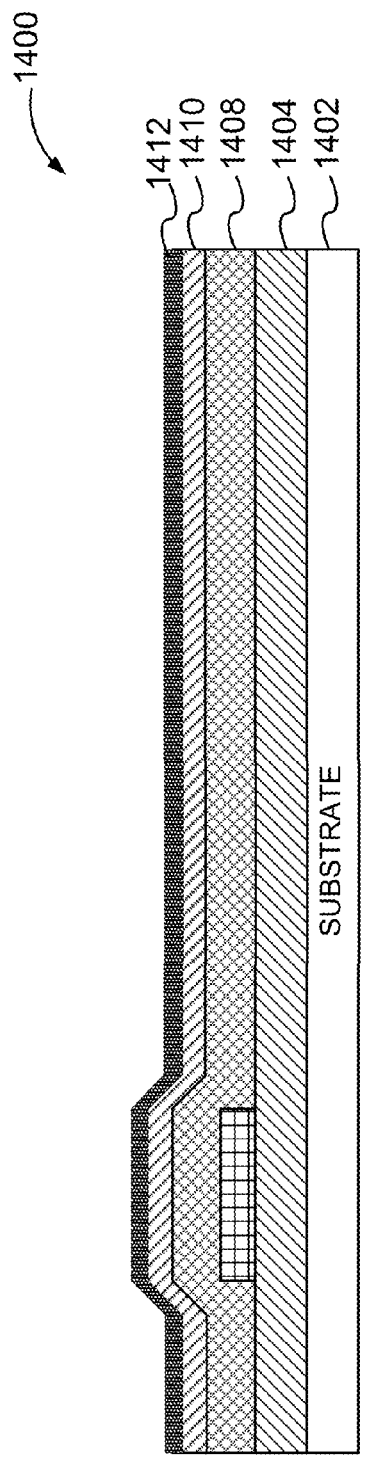
Figure 14F:
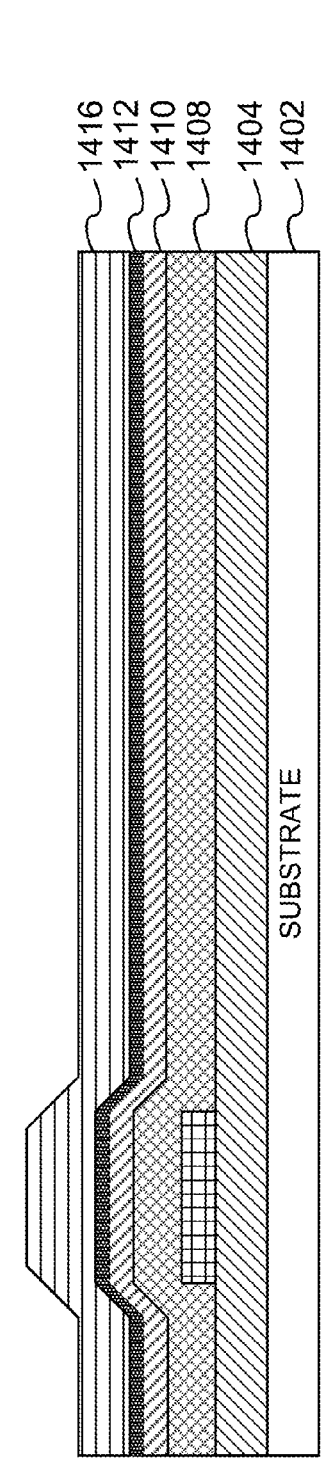
Figure 14I:
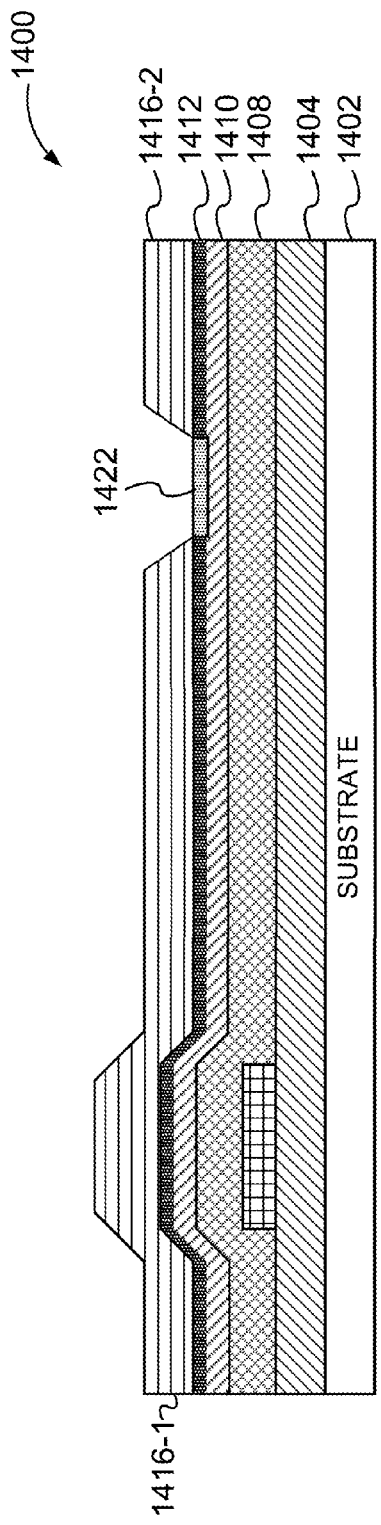
Figure 14J:
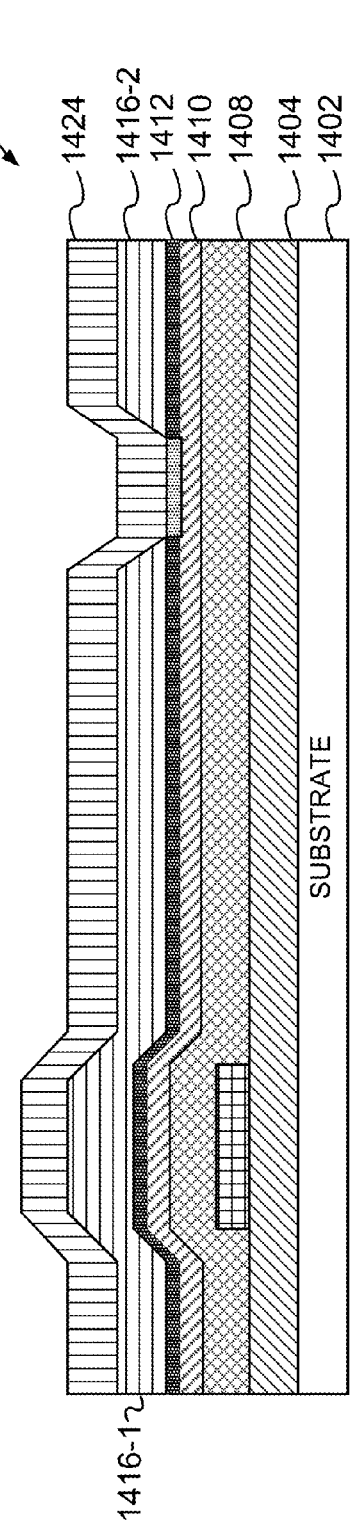
Figure 14Q:
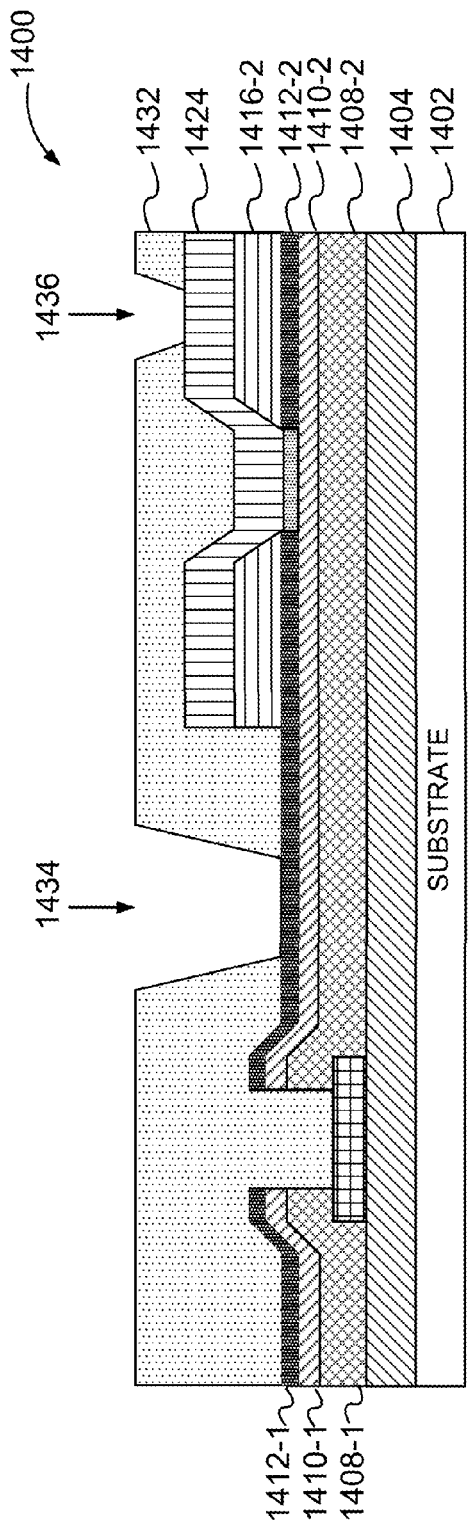
Figure 14R:
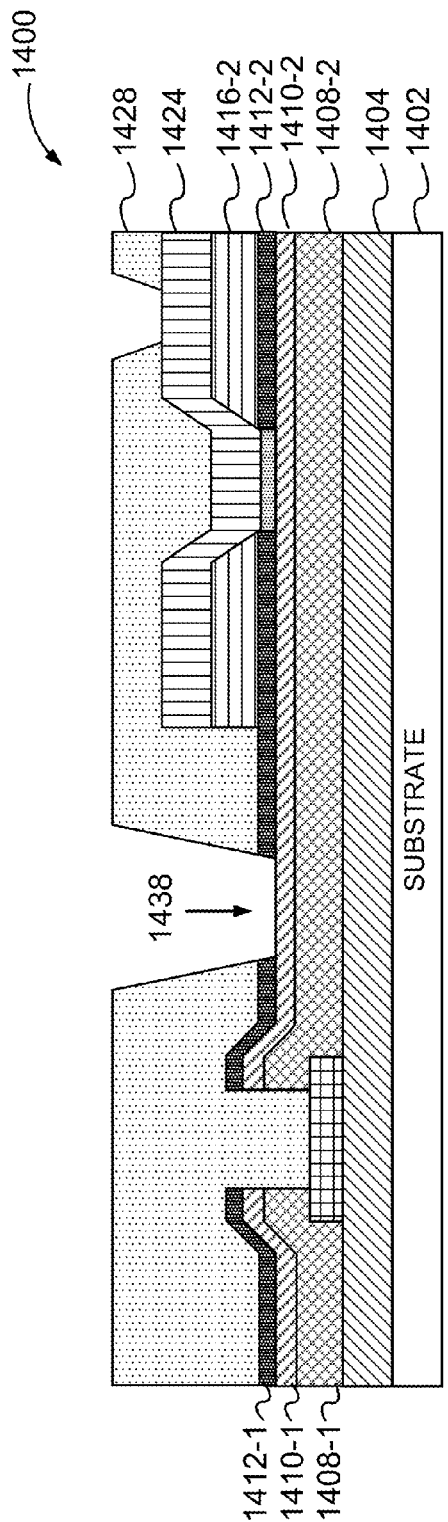
Figure 14S:
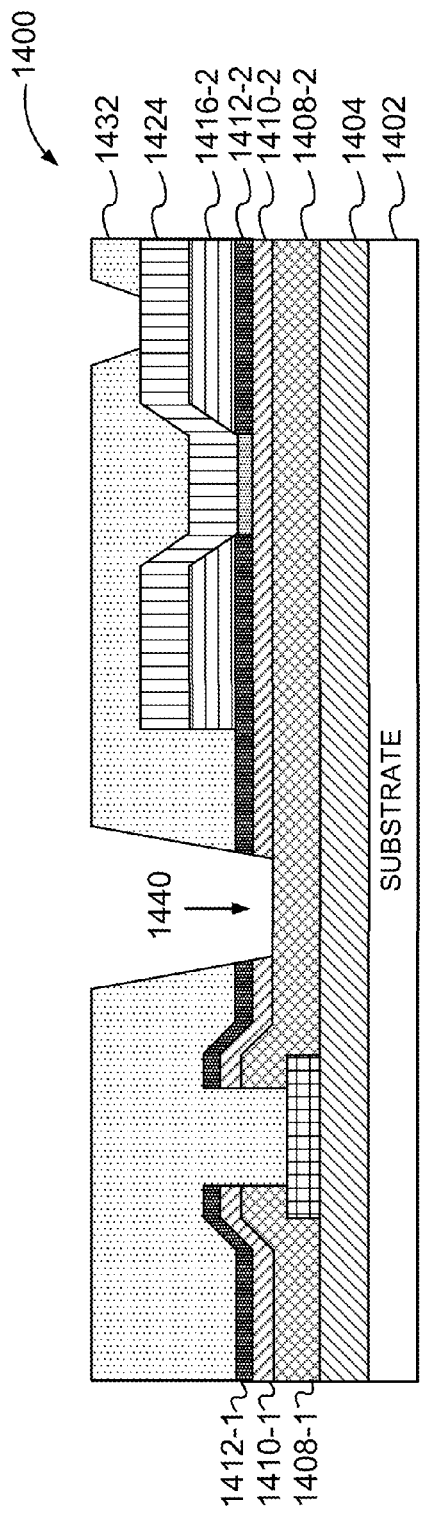
Figure 14T:
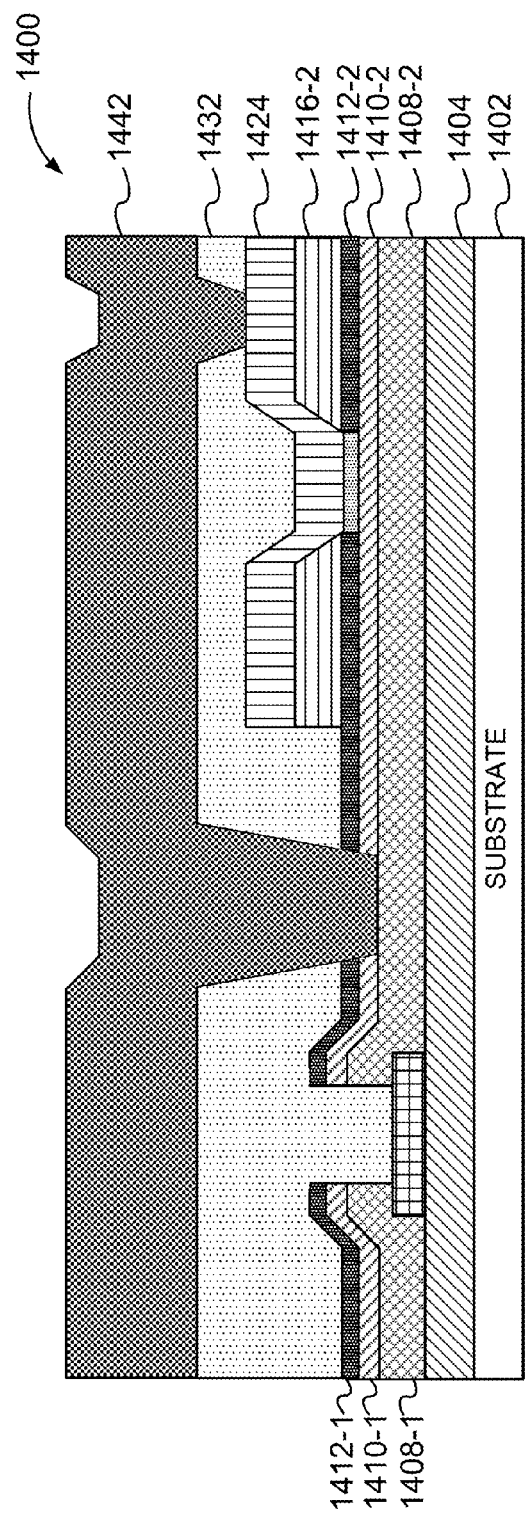
Figure 14U:
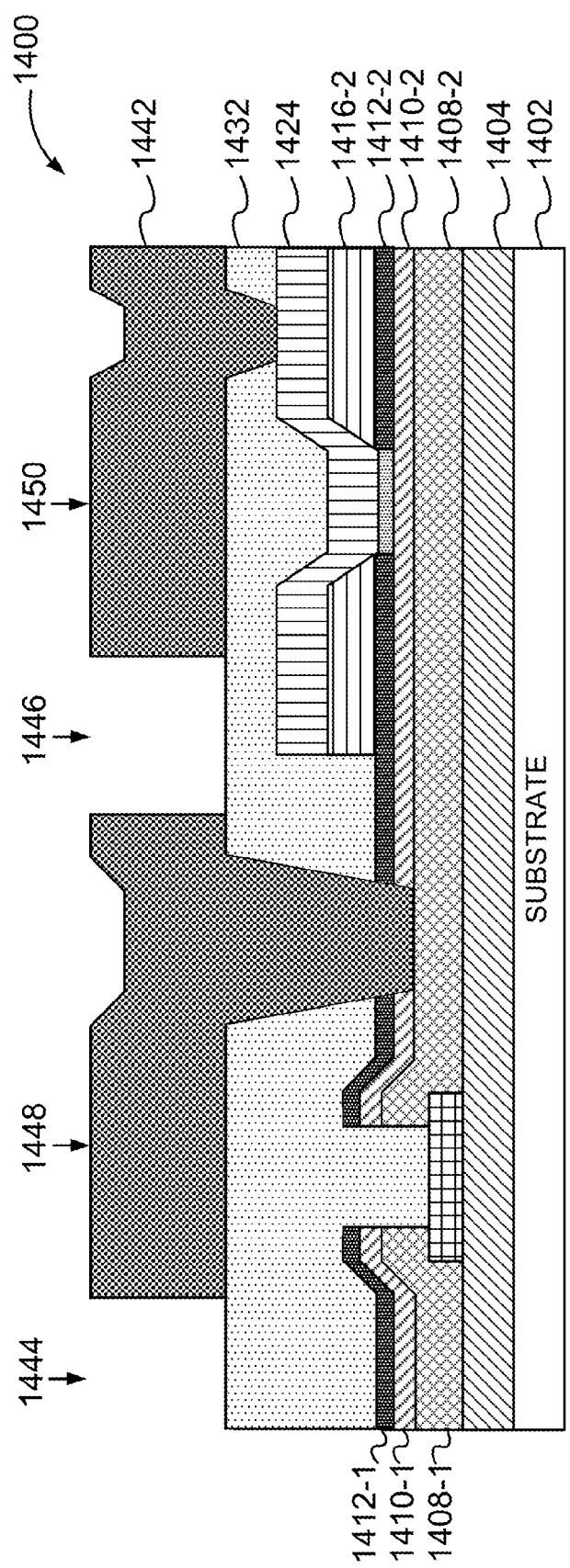
Figure 15A:
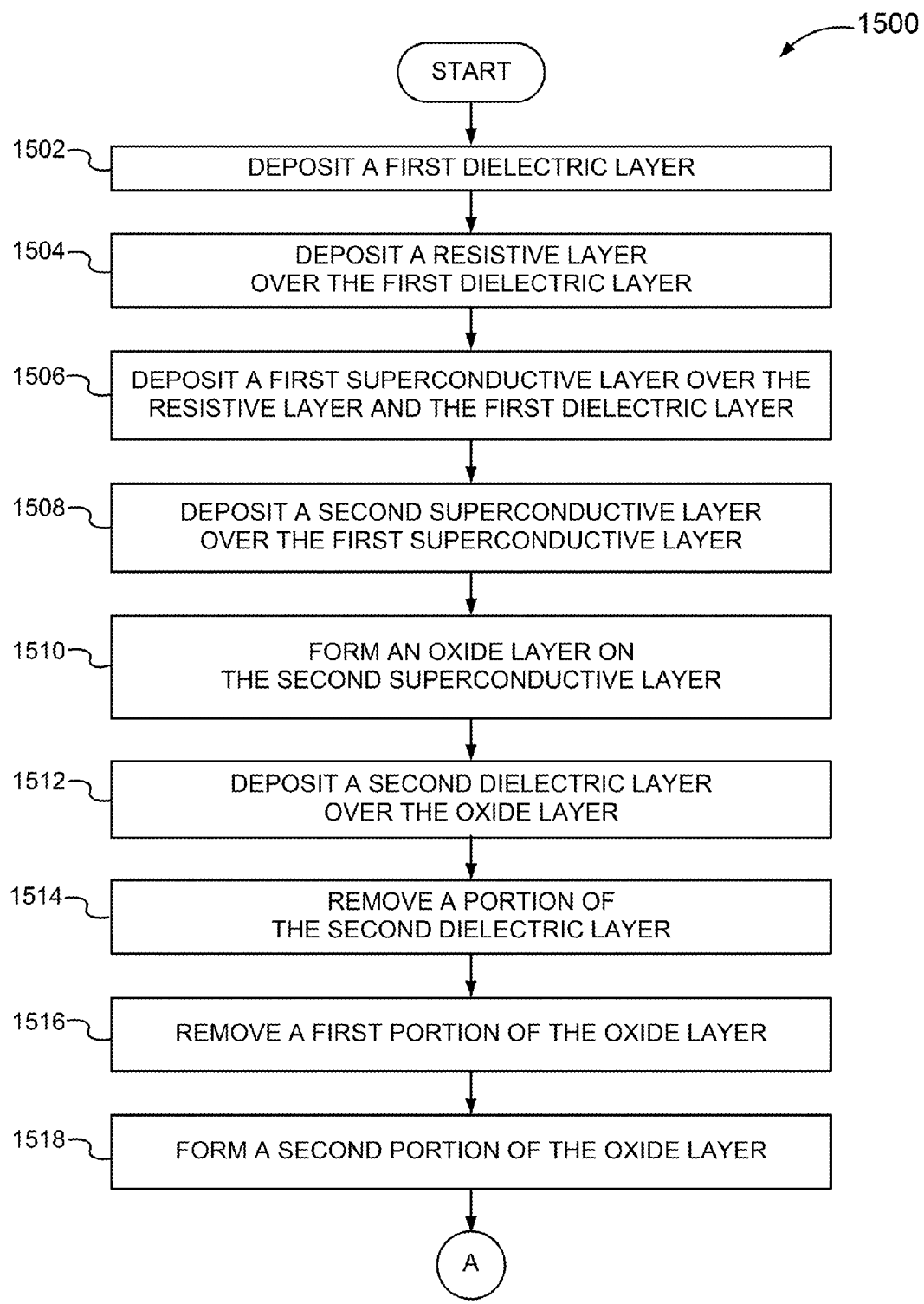
FIGS. 15A-15C show a fabrication method to produce the structures illustrated in FIGS. 14A-14U, according to one illustrated embodiment.
Figure 15B:
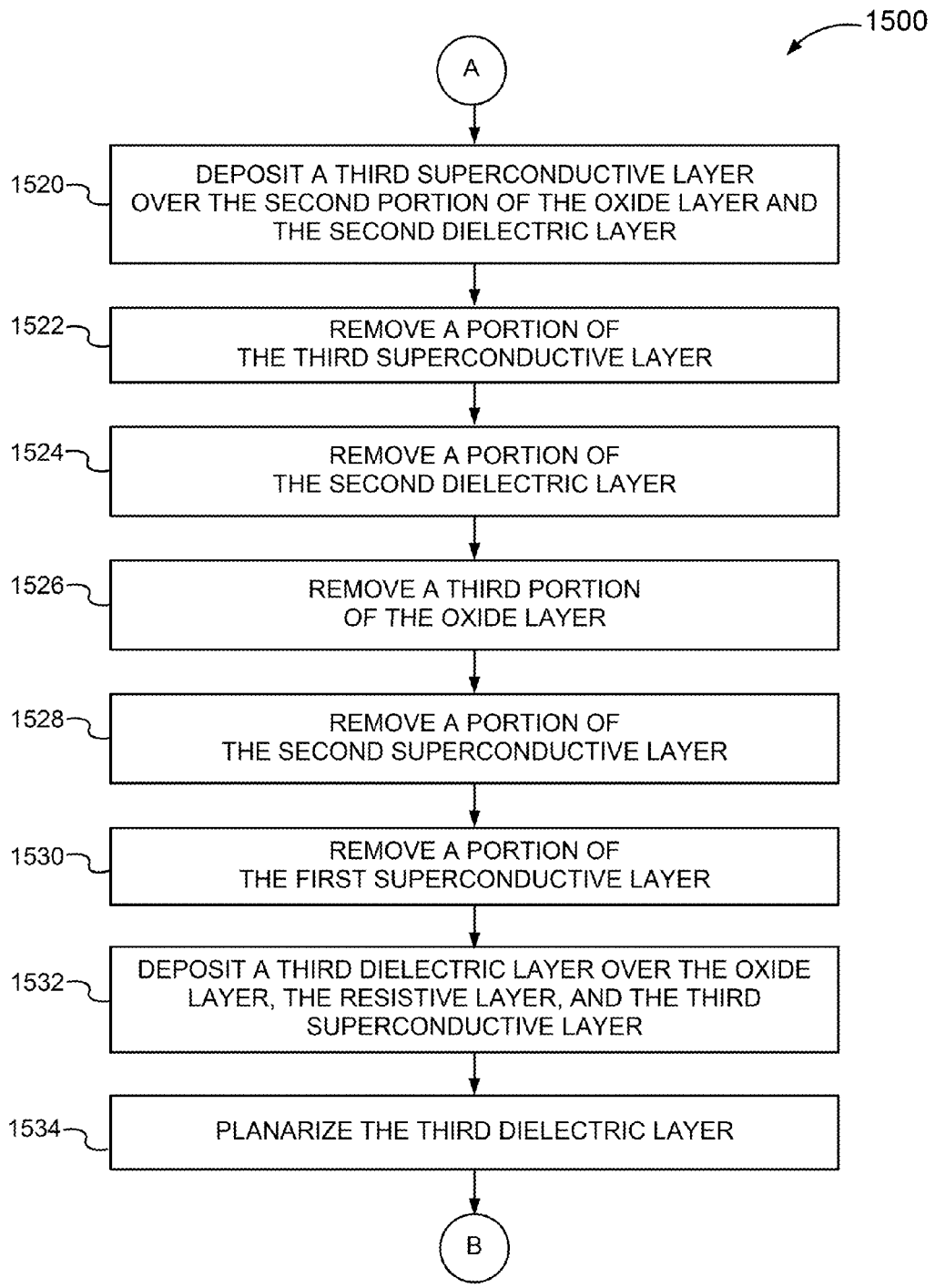
Figure 15C:
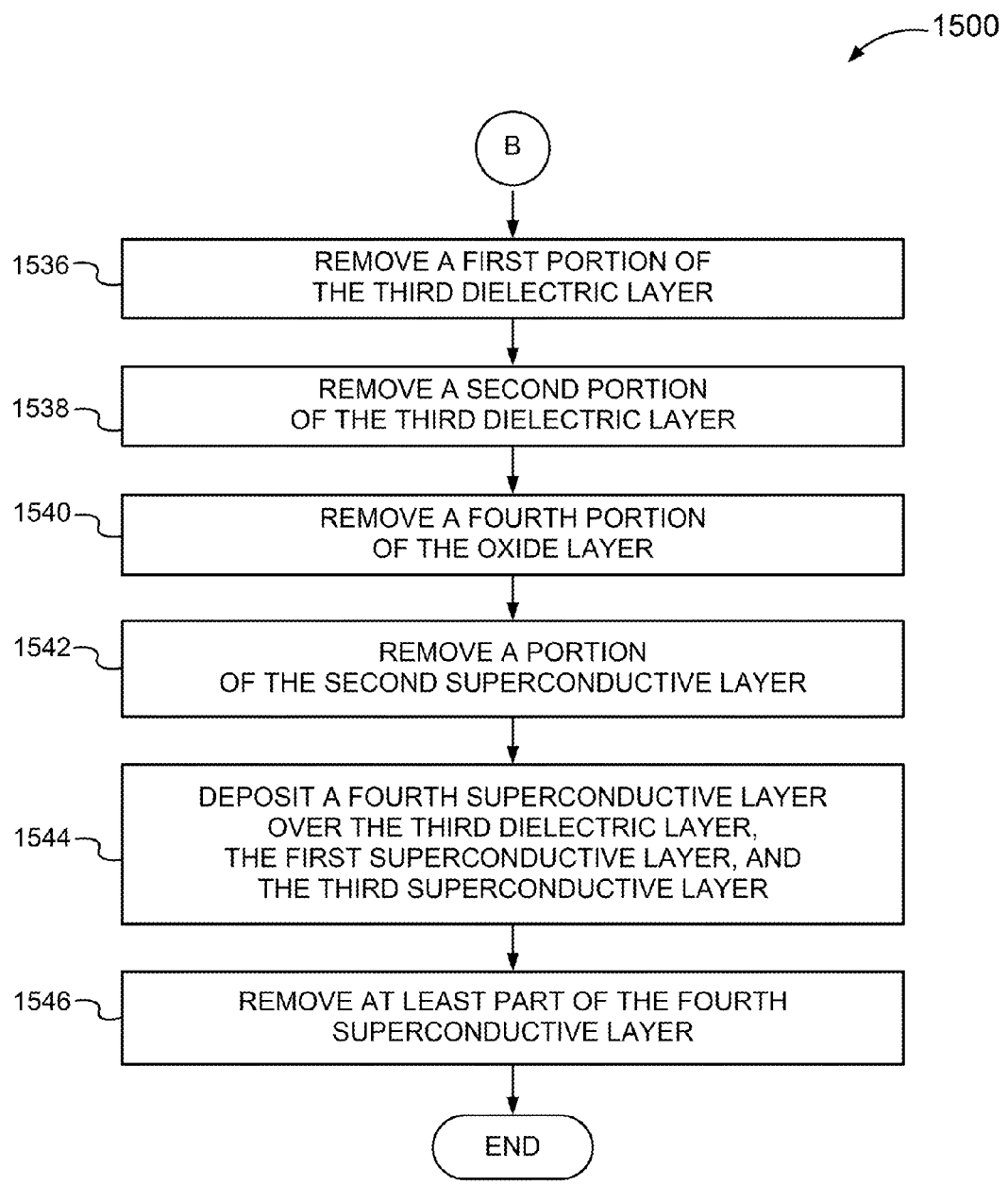

FIGS. 14A-14U are cross-sectional representations of a superconducting integrated circuit 1400 at different phases of a fabrication process, according to one illustrated embodiment. FIGS. 15A-15C show a fabrication method 1500 to produce the structures illustrated in FIGS. 14A-14U, according to one illustrated embodiment.

Referring now to FIGS. 14A and 15A, at 1502, a first dielectric layer 1404 is deposited over (e.g., on) a substrate 1402. In one embodiment, the substrate 1402 is comprised of silicon and the first dielectric layer 1404 is comprised of silicon dioxide. Additionally, the first dielectric layer 1404 may be planarized at 1502. In one embodiment, the thickness of the first dielectric layer 1404 is approximately 1500 angstroms, wherein one angstrom is $1.0 \times 10^{-10}$ meters.

At 1504, a resistive layer 1406 is deposited over (e.g., on) the first dielectric layer 1404. In one embodiment, the resistive layer 1406 is comprised of gold. In one embodiment, the resistive layer 1406 is comprised of platinum (Pt).

One or more portions of the resistive layer 1406 may be removed at 1504 using conventional techniques such that only the portion of the resistive layer 1406 shown in FIG. 14B remains over the first dielectric layer 1404.

For example, the resistive layer 1406 is initially formed on the entire upper surface of the first dielectric layer 1404. A photoresist material is then deposited on the initial resistive layer 1406 and selectively irradiated with UV light through a mask that enables the light to reach only desired portions of the photoresist material. A developer fluid is then used to wash away portions of the photoresist material that were not irradiated with the UV light. A chemical treatment is then used to etch away portions of the resistive layer 1406 that are not covered by the photoresist material, which leaves only the portion of the resistive layer 1406 shown in FIG. 14B on the first dielectric layer 1404. A reagent is then used to remove or strip the remaining photoresist material from the resistive layer 1406.

At 1506, a first superconductive layer 1408 that superconducts at or below a critical temperature is deposited over (e.g., on) the first dielectric layer 1404 and the resistive layer 1406, as shown in FIG. 14C. In one embodiment, the first superconductive layer 1408 is comprised of niobium and has a thickness of approximately 1200 angstroms.

At 1508, a second superconductive layer 1410 is deposited over the first superconductive layer 1408, as shown in FIG. 14D. In one embodiment, the second superconductive layer 1410 is comprised of aluminum and has a thickness of approximately 100 angstroms.

At 1510, an oxide layer 1412 is formed on the second superconductive layer 1410, as shown in FIG. 14E. The oxide layer 1412 may be formed by exposing the second superconductive layer 1410 to oxygen. In one embodiment, the oxide layer 1412 is comprised of aluminum oxide (i.e., $Al_2O_3$).

At 1512, a second dielectric layer 1416 is deposited over (e.g., on) the oxide layer 1412, as shown in FIG. 14F. In one embodiment, the dielectric layer 1416 is comprised of silicon nitride (i.e., $Si_3N_4$) and has a thickness of approximately 500 angstroms. In one embodiment, the dielectric layer 1416 is comprised of silicon dioxide (i.e., $SiO_2$) and has a thickness of approximately 500 angstroms.

At 1514, a portion 1418 of the second dielectric layer 1416 is removed, as shown in FIG. 14G. For example, a conventional technique is used wherein a photoresist material is deposited on the second dielectric layer 1416 and selectively irradiated with UV light through a mask that enables the light to reach only desired portions of the photoresist material. A developer fluid is then used to wash away portions of the photoresist material not irradiated with the UV light. Reactive-ion etching (RIE), which employs chemically-reactive plasma, is used to remove the portion 1418 of the second dielectric layer 1416 stopping at the oxide layer 1412. A reagent is then used to remove or strip the remaining photoresist material from the second dielectric layer 1416.

After the portion 1418 is removed, the second dielectric layer 1416 may be divided into a first portion 1416-1 and a second portion 1416-2, wherein a cavity corresponding to the removed portion 1418 is formed between at least part of the first portion 1416-1 and the second portion 1416-2 of the second dielectric layer 1416. The cavity corresponding to the removed portion 1418 may not completely separate the first portion 1416-1 and the second portion 1416-2. For example, the cavity corresponding to the removed portion 1418 may be a hole in the second dielectric layer 1416. Without loss of generality the second dielectric layer 1416 can be referred to as having a first portion and a second portion. The first portion 1416-1 may include a sloped portion 1416-1a and the second portion 1416-2 may include a sloped portion 1416-2a. For example, each of the sloped portion 1416-1a and the sloped portion 1416-2a may be sloped at an angle of approximately 45 degrees. As shown in FIG. 14G, the sloped portion 1416-1a and the sloped portion 1416-2a may face each other.

At 1516, a portion 1420 of the oxide layer 1412 that was formed on a portion 1410a of the second superconductive layer 1410 is removed, as shown in FIG. 14H. The portion 1420 of the oxide layer 1412 is exposed after the portion 1418 of the second dielectric layer 1416 is removed. A sputter etching process may be used to remove the portion 1420 of the oxide layer 1412. After the portion 1420 is removed, a cavity corresponding to the removed portion 1420 is formed between a first portion 1412-1 and a second portion 1412-2 of the oxide layer 1412.

At 1518, a portion 1422 of the oxide layer 1412 is formed on the portion 1410a of the second superconductive layer 1410, as shown in FIG. 14I. For example, the portion 1410a of the second superconductive layer 1410 that is exposed by removing the portion 1420 of the oxide layer 1412 is exposed to oxygen. The portion 1422 may be formed in a controlled manner such that a desired resistance-area product ($R_nA$) is achieved. The portion 1422 of the oxide layer 1412 may have a first thickness and the first portion 1412-1 and the second portion 1412-2 of the oxide layer 1412 each may have a second thickness that is different than the first thickness. The portion 1422 may be a quantum tunneling barrier.

At 1520, a third superconductive layer 1424 that superconducts at or below a critical temperature is deposited over (e.g., on) the portion 1422 of the oxide layer 1412 and over (e.g., on) the first portion 1416-1 and the second portion 1416-2 of the second dielectric layer 1416, as shown in FIG. 14J. In one embodiment, the third superconductive layer 1424 is comprised of niobium and has a thickness of approximately 700 angstroms. At 1520, a pump may be used to evacuate air from a chamber to create a vacuum within the chamber and the third superconductive layer 1424 may be deposited in the chamber without breaking the vacuum.

At 1522, a portion 1424a of the third superconductive layer 1424 is removed, as shown in FIG. 14K. For example, a conventional technique is used wherein a photoresist material is deposited on the third superconductive layer 1424 and is selectively irradiated with UV light through a mask that enables the light to reach only desired portions of the photoresist material. A developer fluid is then used to wash away portions of the photoresist material not irradiated with the UV light. RIE is then used to remove the portion 1424a of the third superconductive layer 1424 stopping at second dielectric layer 1416.

At 1524, a portion 1416a of the second dielectric layer 1416 is removed, as shown in FIG. 14L. For example, the photoresist material deposited at 1522 is used in conjunction with RIE to remove the portion 1416a of the second dielectric layer 1416 stopping at the oxide layer 1412. A reagent is then used to remove or strip the remaining photoresist material from the third superconductive layer 1424.

At 1526, a portion 1426 of the oxide layer 1412 is removed, as shown in FIG. 14M. The portion 1426 of the oxide layer 1412 may be removed using conventional techniques. After the portion 1426 of the oxide layer 1412 is removed, the oxide layer 1412 is divided into a first portion 1412-1 and a second portion 1412-2.

At 1528, a portion 1428 of the second superconductive layer 1410 is removed, as shown in FIG. 14N. The portion 1428 of the second superconductive layer 1410 may be removed using conventional techniques. After the portion 1428 of the second superconductive layer 1410 is removed, the second superconductive layer 1410 is divided into a first portion 1410-1 and a second portion 1410-2.

At 1530, a portion 1430 of first superconductive layer 1408 is removed, as shown in FIG. 14O. The portion 1430 of the first superconductive layer 1408 may be removed using conventional techniques. After the portion 1430 of the first superconductive layer 1408 is removed, the first superconductive layer 1408 is divided into a first portion 1408-1 and a second portion 1408-2.

At 1532, a third dielectric layer 1432 is deposited over (e.g., on) at least part of the oxide layer 1412, at least part of the resistive layer 1406, and at least part of the third superconductive layer 1424, as shown in FIG. 14P.

At 1534, the third dielectric layer 1432 is planarized. In one embodiment, the third dielectric layer 1432 is comprised of silicon dioxide and is planarized using a chemical-mechanical planarization (CMP) process such that a thickness t (shown in FIG. 14P) of the third dielectric layer 1432 is approximately 2000 angstroms.

At 1536, a first portion 1434 of the third dielectric layer 1432 is removed, as shown in FIG. 14Q. The first portion 1434 of the third dielectric layer 1432 may be removed using conventional techniques. The first portion 1434 of the third dielectric layer 1432 is disposed over the second portion of the oxide layer 1412-2.

At 1538, a second portion 1436 of the third dielectric layer 1432 is removed, as shown in FIG. 14Q. The second portion 1436 of the third dielectric layer 1432 may be removed using conventional techniques. The second portion 1436 of the third dielectric layer 1432 is disposed over the third superconductive layer 1424.

At 1540, a portion 1438 of the oxide layer 1412 is removed, as shown in FIG. 14R. The portion 1438 of the oxide layer 1412 may be removed using conventional techniques.

At 1542, a portion 1440 of the second superconductive layer 1410 is removed, as shown in FIG. 14S. The portion 1440 of the second superconductive layer 1410 may be removed using conventional techniques.

At 1544, a fourth superconductive layer 1442 that superconducts at or below a critical temperature is deposited over (e.g., on) at least part of the third dielectric layer 1432, at least part of the second portion 1408-2 of the first superconductive layer 1408, and at least part of the third superconductive layer 1424, as shown in FIG. 14T. In one embodiment, the fourth superconductive layer 1442 is comprised of niobium.

At 1546, a first portion 1444 and a second portion 1446 of the fourth superconductive layer 1442 are removed, as shown in FIG. 14U. The first portion 1444 and the second portion 1446 of the fourth superconductive layer 1442 may be removed using conventional techniques. After the first portion 1444 and the second portion 1446 of the fourth superconductive layer 1442 are removed, a first contact electrode 1448 and a second contact electrode 1450 are formed.

As shown in FIG. 14U, the resulting superconducting integrated circuit 1400 includes a Josephson junction that is formed by at least the second portion 1408-2 of the first superconductive layer 1408, the second portion of the second superconductive layer 1410-2, the second portion of the second superconductive layer 1410-2, the portion 1422 of the oxide layer 1412, and the third superconductive layer 1424. The second portion 1408-2 of the first superconductive layer 1408 acts as an electrode of the Josephson junction. An external electrical connection to the second portion 1408-2 of the first superconductive layer 1408 may be made by way of the first contact electrode 1448. The third superconductive layer 1424 acts as a counter electrode of the Josephson junction. An external electrical connection to the third superconductive layer 1424 may be made by way of the second contact electrode 1450. The third dielectric layer 1432 may protect the Josephson junction from being damaged while the first contact electrode 1448 and the second contact electrode 1450 are formed and while external electrical connections are made thereto. Accordingly, the structure of the superconducting integrated circuit 1400 may protect the Josephson junction from damage during fabrication and use of the superconducting integrated circuit 1400.

The various embodiments described above can be combined to provide further embodiments. To the extent that they are not inconsistent with the specific teachings and definitions herein, all of the U.S. patents, U.S. patent application publications, U.S. patent applications, foreign patents, foreign patent applications and non-patent publications referred to in this specification and/or listed in the Application Data Sheet, including but not limited to U.S. Provisional Patent Application No. 61/940,278, filed Feb. 14, 2014, U.S. Provisional Patent Application No. 61/979,406, filed Apr. 14, 2014, U.S. Provisional Patent Application No. 61/987,782, filed May 2, 2014, U.S. Provisional Patent Application No. 61/156,377, filed Feb. 27, 2009, U.S. Patent Application No. 12/992,049, filed Nov. 10, 2010, U.S. Provisional Patent Application No. 61/608,379, filed Mar. 8, 2012, and U.S. Provisional Patent Application No. 61/714,642, filed Oct. 16, 2012 are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of fabricating a Josephson junction, the method comprising:
 depositing an inner superconductive layer, the inner superconductive layer comprising a material that is superconductive in a range of critical temperatures;
 forming an oxide layer that overlies at least part of the inner superconductive layer;
 depositing an outer superconductive layer to overlie at least part of the oxide layer, the outer superconductive layer comprising a material that is superconductive in a range of critical temperatures;
 forming a mask layer that overlies at least part of the outer superconductive layer;
 removing a first portion of the mask layer;
 removing a first portion of the outer superconductive layer to form at least one structure from the outer superconductive layer, the at least one structure comprising at least one lateral exposed surface;
 applying an oxygen plasma or a nitrogen plasma to the at least one lateral exposed surface of the at least one structure to convert at least part of the at least one lateral surface into a second oxide layer or a nitride layer; and
 after applying the oxygen plasma or the nitrogen plasma to the at least one lateral exposed surface of the at least one structure, removing the mask layer to expose at least a portion of an upper surface of the at least one structure.

2. The method of claim 1 wherein the removing the first portion of the outer superconducting layer is performed after the removing the first portion of the mask layer, and the applying the oxygen plasma or the nitrogen plasma to the at least one lateral exposed surface of the at least one structure is performed after the removing of the first portion of the outer superconductive layer.

3. The method of claim 1 wherein the depositing the inner superconductive layer includes depositing a layer of niobium or aluminum; the depositing the outer superconductive layer includes depositing a layer of niobium; and the forming the oxide layer includes forming a layer of niobium oxide or aluminum oxide.

4. The method of claim 1 wherein the removing the first portion of the outer superconductive layer includes reactive-ion etching the portion of the outer superconductive layer to form a junction that extends from the oxide layer and which has at least one lateral exposed surface.

5. The method of claim 1, further comprising:
 depositing a dielectric layer to overlie at least part of a substrate,
 wherein the depositing the inner superconductive layer includes depositing the inner superconductive layer to overlie at least part of the dielectric layer.

6. The method of claim 1, further comprising:
 depositing an intermediate superconductive layer to overlie at least part of the inner superconductive layer, the intermediate superconductive layer comprising a material that is superconductive in a range of critical temperatures.

7. The method of claim 6 wherein the depositing the inner superconductive layer includes depositing a layer of niobium;

the depositing the intermediate superconductive layer includes depositing a layer of aluminum;

the depositing the outer superconductive layer includes depositing a layer of niobium; and the forming the oxide layer includes forming a layer of aluminum oxide.

8. The method of claim 1, wherein the applying the oxygen plasma to the at least one lateral exposed surface of the at least one structure includes applying an oxygen plasma to the at least one lateral exposed surface of the at least one structure on which the mask layer is not formed.

9. The method of claim 8 wherein the applying the oxygen plasma to the at least one lateral exposed surface of the at least one structure on which the mask layer is not formed includes applying the oxygen plasma to one or more portions of the outer superconductive layer disposed between the mask layer and the oxide layer.

10. The method of claim 1 wherein the forming the mask layer that overlies the outer superconductive layer includes forming a mask layer on an upper surface of the outer superconductive layer.

* * * * *